United States Patent
Saitoh et al.

(10) Patent No.: US 7,719,031 B2
(45) Date of Patent: May 18, 2010

(54) HETEROJUNCTION BIPLOAR TRANSISTOR AND METHOD FOR MANUFACTURING SAME

(75) Inventors: Tohru Saitoh, Ibaraki (JP); Takahiro Kawashima, Osaka (JP); Ken Idota, Moriguchi (JP); Yoshihiko Kanzawa, Yawata (JP); Teruhito Ohnishi, Hirakata (JP)

(73) Assignee: Panasonic Corporation, Osaka (JP)

( * ) Notice: Subject to any disclaimer, the term of this patent is extended or adjusted under 35 U.S.C. 154(b) by 945 days.

(21) Appl. No.: 10/564,085

(22) PCT Filed: Jul. 6, 2004

(86) PCT No.: PCT/JP2004/009901

§ 371 (c)(1),
(2), (4) Date: Aug. 16, 2006

(87) PCT Pub. No.: WO2005/006444

PCT Pub. Date: Jan. 20, 2005

(65) Prior Publication Data

US 2007/0085167 A1   Apr. 19, 2007

(30) Foreign Application Priority Data

Jul. 11, 2003 (JP) .............................. 2003-273325

(51) Int. Cl.
   *H01L 29/74* (2006.01)
(52) U.S. Cl. .................. 257/197; 257/191; 257/200; 257/201; 257/565; 257/576; 257/E31.013; 257/E31.044; 257/E31.049; 438/170; 438/172; 438/189; 438/234; 438/235; 438/309; 438/312
(58) Field of Classification Search .......... 257/565, 257/576, 191, 200, 201, E31.043–E31.049; 438/170, 172, 189, 234, 309, 312, 235
   See application file for complete search history.

(56) References Cited

U.S. PATENT DOCUMENTS

| | | | |
|---|---|---|---|
| 5,620,907 A | 4/1997 | Jalali-Farahani et al. | |
| 5,861,640 A | 1/1999 | Gomi | |
| 6,177,717 B1 | 1/2001 | Chantre et al. | |
| 6,551,891 B1 | 4/2003 | Chantre et al. | |
| 2001/0039095 A1* | 11/2001 | Marty | 438/321 |
| 2005/0051797 A1* | 3/2005 | Fan et al. | 257/197 |

FOREIGN PATENT DOCUMENTS

| | | |
|---|---|---|
| JP | 9-181091 A | 7/1997 |
| JP | 9-199511 A | 7/1997 |
| JP | 2000-31155 A | 1/2000 |
| JP | 2001-244275 A | 9/2001 |
| JP | 2001-319935 A | 11/2001 |

OTHER PUBLICATIONS

Jagannathan, B., et al. "Self-Aligned SiGe NPN Transistors With 285 GHz $f_{max}$ and 207 GHz $f_T$ in a Manufacturable Technology" IEEE Electron Device Letters, vol. 23, No. 5, May 2002, pp. 258-260.

* cited by examiner

*Primary Examiner*—Lynne A Gurley
*Assistant Examiner*—Meiya Li
(74) *Attorney, Agent, or Firm*—McDermott Will & Emery LLP

(57) ABSTRACT

A bipolar transistor 120 comprises a substrate 1, a intrinsic base region 11 and an extrinsic base region 12. The intrinsic base region 11 comprises a silicon buffer layer 109 comprised of silicon which is formed on the substrate 1, and a composition-ratio graded base layer 111 which is formed on the silicon buffer layer and comprises silicon and at least germanium and where a composition ratio of the germanium to the silicon varies in a thickness direction of the composition-ratio graded base layer 111. The extrinsic base region 12 comprises an extrinsic base formation layer 113 comprised of silicon which is formed on the substrate and adjacent to the silicon buffer layer. And the thickness of the extrinsic base formation layer 113 is not less than 40 nm.

4 Claims, 28 Drawing Sheets

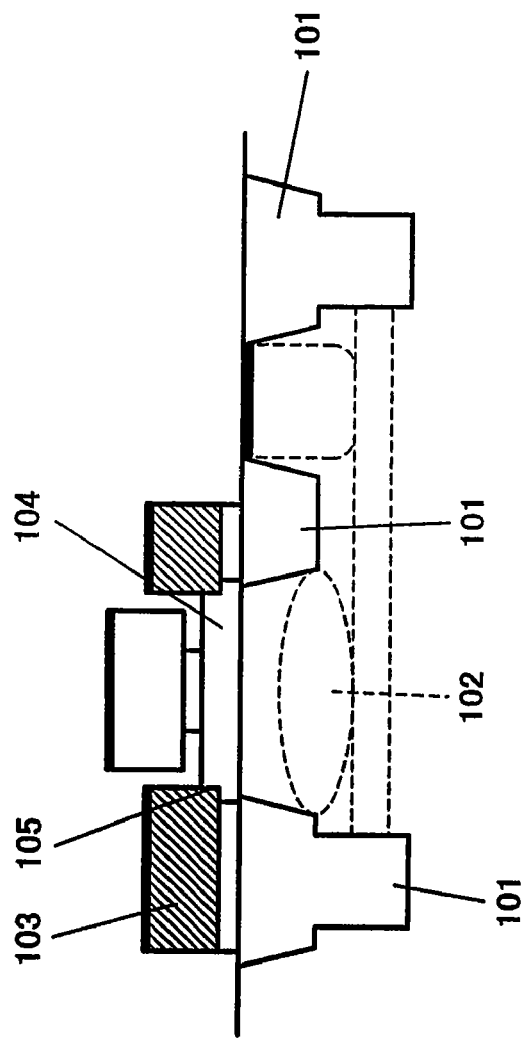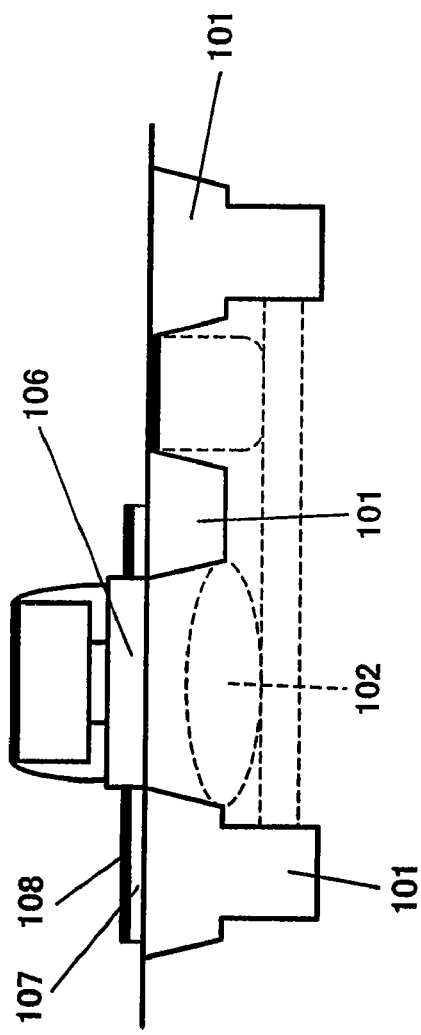
FIG. 23(a) PRIOR ART
FIG. 23(b) PRIOR ART

US 7,719,031 B2

HETEROJUNCTION BIPLOAR TRANSISTOR AND METHOD FOR MANUFACTURING SAME

RELATED APPLICATION

This application is the U.S. National Phase under 35 U.S.C. §371 of International Application No. PCT/JP2004/009901, filed on Jul. 6, 2004, which in turn claims the benefit of Japanese Application No. 2003-273325, filed on Jul. 11, 2003, the disclosures of which Applications are incorporated by reference herein.

TECHNICAL FIELD

The present invention relates to a heterojunction bipolar transistor with base layers formed by epitaxial growth and a method for manufacturing the same.

BACKGROUND ART

In the field of bipolar transistors, energetically developed are heterojunction bipolar transistors (HBTs) in which materials different in bandwidth are introduced to base layers using epitaxial growth to increase device speed. HBT with base layers using family-IV semiconductor materials such as SiGe (silicon-germanium) material and SiGeC (silicon-germanium carbon) material is highly expected as a high-speed device because the device can be formed on a Si substrate and integration with CMOS circuits and large substrate are advantageous in terms of high performance and low cost.

A typical configuration example of a conventional HBT using SiGe for heterojunction (hereinafter referred as to SiGe HBT) is explained with reference to FIG. 23. While the HBT using SiGe material for base layers is exemplified here, a HBT using SiGeC material for the base layers is to have the same configuration.

The SiGe HBT is generally classified into a double-polysilicon structure and a single-polysilicon structure. FIG. 23(a) is a typical schematic sectional view of the SiGe HBT of the double-polysilicon structure and FIG. 23(b) is that of the SiGe HBT of the single-polysilicon structure.

First, the SiGe HBT of double-polysilicon is explained with reference to FIG. 23(a).

A polysilicon layer 103 corresponding to an extrinsic base region is formed in advance on a Si substrate provided with an isolation area 101 and a collector region 102. And the polysilicon layer 103 is subject to a patterning treatment by etching. An epitaxial SiGe layer 104 corresponding to an intrinsic base region selectively and epitaxially grows on an HBT formation region removed the polysilicon layer 103.

In this configuration, the polysilicon layer 103 and the epitaxial SiGe layer 104 can not be formed simultaneously or continuously. Therefore, it is difficult to avoid native oxide film formed on an interface 105 between the epitaxial SiGe layer 104 and the polysilicon layer 103. Also, there is a possibility of generating void inside the interface 105. Thereby, the SiGeHBT of the double-polysilicon structure increases contact resistance between the polysilicon layer 103 and the epitaxial SiGe layer 104 and it causes a problem that uneven contact resistance exists among products. And it has further problems that manufacturing process is complicated and process window is small during selective growth. From these viewpoints, the SiGeHBT of the double-polysilicon structure is not suitable for mass production.

Next, the SiGeHBT of the single-polysilicon structure is explained with reference to FIG. 23(b).

Using a non-selective growth method, an epitaxial SiGe layer 106 corresponding to the intrinsic base region epitaxially grows on the Si substrate directly above the collector region 102. Simultaneously, a polySiGe layer 107 corresponding to an extrinsic base region epitaxially grows on an isolation region 101. And then a silicide layer 108 is formed on a surface of the polySiGe layer 107.

Because this structure enables the PolySiGe layer 107 and the epitaxial SiGe 106 to form simultaneously, neither native oxide film nor void is formed on the interface between epitaxial SiGe layer 107 and polySiGe layer 106. Therefore, increase of contact resistance between both layers is fundamentally solved. And the manufacturing process of the SiGe HBT of the single polysilicon structure is simpler than that of the double-polysilicon structure. Further the process window of the non-selective growth is larger than that of selective growth.

Thus, the SiGeHBT of the single-polysilicon structure is suitable for mass production.

International Publication WO01/88994 is a public-known material to disclose SiGeHBT technology.

DISCLOSURE OF THE INVENTION

With the SiGeHBT of the conventional SiGeHBT structure, the epitaxial SiGe layer 106 corresponding to the intrinsic base region and the polySiGe layer 107 corresponding to the extrinsic base region are formed by the same manufacturing process simultaneously, thereby a Ge composition profile existing in the extrinsic base region is inevitably coincided with that existing in the intrinsic base region.

However, the Ge composition profile optimized in the intrinsic base region is not necessarily suitable as a Ge composition profile of the extrinsic base region. Accordingly, the inventor considers the following defects occur.

FIG. 24 shows layer structure of the base layers of the conventional SiGeHBT, and FIG. 25 shows change of the Ge composition profile contained in each layer of the base layers.

A Si buffer layer 109, a non-dope SiGe spacer layer 110, a B-dope SiGe graded base layer 111, and a Si cap layer 112 are formed in order upwardly from the Si substrate. These layers, 109, 110, 111, 112 as a whole are represented by "the intrinsic base region 106" and correspond to the monocrystal epitaxial SiGe layer 106 shown in FIG. 23(b).

Similarly, a first layer 113 as an extrinsic base formation layer (the layer formed simultaneously with the Si buffer layer 109), a second layer 114 formed simultaneously with the non-dope SiGe spacer layer 110, a third layer 115 formed simultaneously with the B-dope SiGe graded base layer 111, and a fourth layer 116 formed simultaneously with the Si cap layer 112 are formed in order upwardly from the substrate. These layers 113, 114, 115 and 116 as a whole are represented by "the extrinsic base region 107" and correspond to the polycrystal polySiGe layer 107 shown in FIG. 23(b).

The Ge composition profile of the layer structure corresponding to the intrinsic base region 106 is optimized to improve device property. For example, the Si graded base layer 111 has the graded composition base structure in which Ge content gradually increases from the emitter to the collector. Thereby, an electric field is formed inside the base layer, which accelerates the carrier (electron) so as to decrease electron transit time for the base layer, and then high frequency property (high speed of the device) is obtained.

In addition, recently, it has been studied to decrease an electron transit time for the base layer by thinning thickness of the intrinsic base region 106 (e.g. thinning thickness of the Si cap layer 112) to increase a speed of SiGe HBTs.

In FIG. 26, thickness of the Si cap layer 112 of the intrinsic base region 106 is represented by a horizontal axis and the base resistance and the maximum gained frequency fmax is represented by a vertical axis. FIG. 26 illustrates the state of variation of measured fmax data and the base resistance for the thickness of Si cap layer 112.

Values of the vertical axis (values of base resistance and fmax) are relative values which are normalized and rearranged with each value in 30 nm thickness of the Si cap 112.

According to FIG. 26, an unexpected result is that although the Si cap layer 112 is thinned and intended to speed up the device, the base resistance rapidly increases with the thickness of not less than 10 nm and then fmax largely decreases.

The primary factor of increase of this base resistance may be that because the Si cap layer 112 of the intrinsic base region 106 and the fourth layer 116 comprising silicon of the extrinsic base region 107 are thinned, Ge atom contained in the lower third layer 115 (SiGe layer) inhibits the formation of the silicide layer so as to increase resistance of the silicide layer 108 during the silicidation of the surface of the fourth layer 116.

That is, it may be assumed that silicidation of silicon is inhibited due to the fact that the Ge concentration in the vicinity of the surface of the fourth layer 116 with a decrease in the film thickness of the fourth layer 116 of the extrinsic base region 107 increases, thereby increasing a resistance of the silicide layer 108

It has been reported that this phenomenon is especially remarkable in the silicidation using cobalt (Co) in "IEEE Electron Device Letters vol. 23 No. 8 (2002) 464-466".

Rim et al. have described the problem that similarly in MOSFET using SiGe material the resistance of the silicide layer resulting from Ge atom also increases and the countermeasure against the problem in "2002 Symposium on VLSI Technology Digest 10-4".

Rim et al. showed a finding that resistance of the silicide layer can be decreased by selective growth of the Si layer referred to as "raised source/drain (RDS)" on the SiGe layer immediately before the silicidation.

Further, Jagannathan et al. have described in "IEEE Electron Device Letters Vol. 23 (2002) P. 258-260" that, in the process of manufacturing SiGe HBTs of the single-poly silicon structure, the intrinsic base region is masked and the layer referred to as "raised extrinsic base" is formed on the extrinsic base region by selective growth after the epitaxial SiGe layer corresponding to the intrinsic base region and the polySiGe layer corresponding to the extrinsic base region are formed simultaneously. Although Jagannathan et al. did not refer to the resistance of the silicide layer, they may imply that this function of "raised extrinsic base" improves inhibition of silicidation resulting from Ge atom.

However, these counter measures each require additional steps of selective growth, which invites complicated processes and high cost of manufacturing SiGe HBTs.

An object of the present invention is to provide a SiGe HBT of the single-poly silicon structure and a method of manufacturing the same where the silicide layer can be evenly formed in the extrinsic base region for higher speed of transistor performance, so that high silicide resistance resulting from Ge atom can be prevented securely without complicated processes of manufacturing transistors.

In order to accomplish this object, a bipolar transistor of the present invention comprises a substrate; an intrinsic base region having a silicon buffer layer comprised of silicon which is formed on said substrate, and a composition-ratio graded base layer which is formed on the silicon buffer layer and comprises silicon and at least germanium and where a composition ratio of the germanium to the silicon varies in a thickness direction of the composition-ratio graded base layer; and an extrinsic base region having an extrinsic base formation layer comprised of silicon which is formed on the substrate and adjacent to the silicon buffer layer; wherein each of the extrinsic base formation layer and the silicon buffer layer has a thickness of not less than 40 nm and a surface of the extrinsic base formation layer is silicided.

Further, a bipolar transistor of the present invention comprises a substrate; an intrinsic base region having a silicon buffer layer comprised of silicon which is formed on said substrate, and a composition-ratio graded base layer which is formed on the silicon buffer layer and comprises silicon and at least germanium and where a composition ratio of the germanium to the silicon varies in a thickness direction of the composition-ratio graded base layer; and an extrinsic base region having an extrinsic base formation layer comprised of silicon which is formed on said substrate and adjacent to the silicon buffer layer; wherein thickness of the extrinsic base formation layer is substantially equal to a thickness of the silicon buffer layer and a surface of the extrinsic base formation layer is silicided.

With these configurations, the silicide layer can be formed on the extrinsic base formation layer after the extrinsic base formation layer with a predetermined thick film has been formed, thereby the silicide layer can be evenly formed on the extrinsic base formation layer. Further, a layer containing germanium does not exist beneath the extrinsic base formation layer, so that the silicidation is not inhibited by Ge atom during the formation of silicide layer in the extrinsic base formation layer, thereby higher silicide resistance can be securely prevented.

Here, the composition-ratio graded base layer may be a silicon germanium graded base layer which comprises silicon and germanium.

The silicon buffer layer may be comprised of monocrystal and the extrinsic base formation layer may be comprised of polycrystal.

Further, a method of manufacturing a bipolar transistor of the present invention comprises a step of forming a masking layer on a substrate so as to enclose a region including an active region; a step of forming an epitaxial base layer such that the epitaxial base layer has a silicon layer and a silicon-germanium layer in the active region; a step of, non-selectively with respect to the epitaxial base layer, forming a poly-base layer such that the poly-base layer has a silicon layer and a silicon-germanium layer in an isolation region of the region including the active region; and a step of thereafter removing the silicon-germanium layer of the poly-base layer by etching process to expose a surface of the silicon layer as an extrinsic base formation layer, and a step of forming a silicide layer on the exposed surface.

This manufacturing method employs steps where after the silicon-germanium layer has been laminated on the extrinsic base formation layer, the silicon-germanium layer is removed by etching to form the silicide layer on the extrinsic base formation layer. Thereby, silicidation is not inhibited by Ge atom in the step of forming the silicide layer on the extrinsic base formation layer and increase of silicide resistance is securely prevented.

The etching process is preferably a wet etching which uses an etchant made of a mixture comprising nitric acid, water and fluorinated acid.

Further, a bipolar transistor of the present invention comprises a substrate; an intrinsic base region having a silicon buffer layer comprised of silicon which is formed on said substrate, and a composition-ratio graded base layer which is formed on the silicon buffer layer and comprises silicon and at least germanium and where a composition ratio of the germanium to the silicon varies in a thickness direction of the composition-ratio graded base layer; and an extrinsic base region having a first extrinsic base formation layer comprised of silicon which is disposed adjacent to the silicon buffer layer on the substrate; a second extrinsic base formation layer containing germanium which is formed on the first extrinsic base formation layer, together with the composition-ratio graded base layer; and a third extrinsic base layer comprised of silicon which is formed on the second extrinsic base formation layer; wherein germanium content of the second extrinsic base formation layer is lower than that of the composition-ratio graded base layer and a surface of the third extrinsic base formation layer is silicide.

This configuration makes the germanium content of the second extrinsic base formation layer lower than that of the silicon-germanium graded base layer. Thereby, it is ensured to prevent increase of silicide resistance resulting from inhibition of silicidation due to Ge atom during the step of forming the silicide layer on the silicon layer of the second extrinsic base formation layer.

The composition-ratio graded base layer may be comprised of monocrystal and the second extrinsic base formation layer may be comprised of polycrystal.

A method of manufacturing a bipolar transistor of the present invention comprises a step of forming a masking layer on a substrate so as to enclose a region including an active region; a step of forming a first silicon layer in the active region of the region including the active region while forming a second silicon layer in an isolation region of the region including the active region by a first vapor phase growth method; and a step of thereafter forming a first silicon-germanium layer comprised of monocrystal on the first silicon layer while forming a second silicon-germanium layer comprised of polycrystal on the second silicon layer by a second chemical vapor phase growth method based on reactant gas of chlorine addition, wherein a silicide layer is formed on a surface of a third silicon layer as an extrinsic base formation layer formed on the second silicon-germanium layer. Here, thickness of these layers is adjusted such that germanium content of the second silicon-germanium layer is lower than that of the first silicon-germanium layer.

With this manufacturing method, the second silicon-germanium layer comprising silicon and germanium is formed by a vapor phase growth based on reactant gas of chlorine addition; thereby growth of the extrinsic base formation layer is suppressed under etching function of the reactant gas containing chlorine. As a result, germanium content of the second silicon-germanium layer can be made lower than that of the first silicon-germanium layer. And, when forming the silicide layer on the third silicon layer covering the second silicon-germanium layer, it is ensured that silicidation is not affected by Ge atom so as to prevent increase of silicide resistance.

The above-mentioned object of the present invention, other objects, features, and advantages are taught by specific explanation on preferred embodiments mentioned below with reference to attached drawings.

BRIEF DESCRIPTION OF THE DRAWINGS

FIG. 23 is a sectional view showing the conventional SiGe HBT.

DETAILED DESCRIPTION OF PREFERRED EMBODIMENTS

Embodiments of the present invention are explained with reference to the drawings.

First Embodiment

Figure 1:
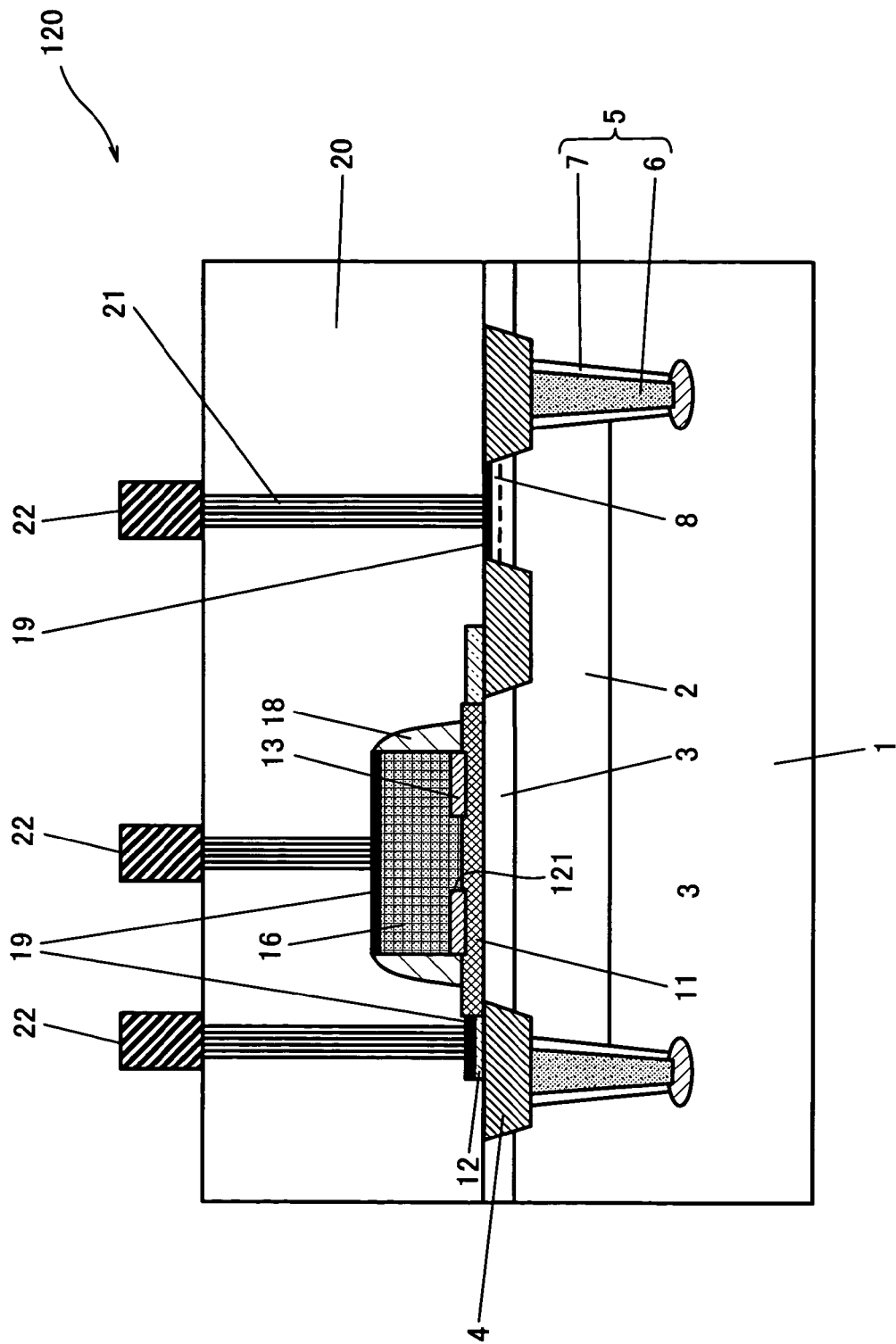
FIG. 1 is a sectional view showing a SiGe HBT of a first embodiment in the present invention.

FIG. 1 is a sectional view showing a configuration of SiGe HBT of a first embodiment in the present invention.

As shown in FIG. 1, arsenic ions are implanted into a surface of a P-type Si substrate 1 to form an N-type subcollector region 2 having appropriately 1 μm depth. A Si monocrystal layer 3 having 0.5 μm thickness epitaxially grows on the Si substrate 1 and the subcollector region 2 while doping an N-type impurity so as to covers the substrate 1 and the subcollector region 2.

A shallow trench 4 buried with a silicon oxide layer is formed so as to extend from a surface of the Si monocrystal layer 3 to the Si substrate 1, as an isolation region. And, a deep trench 5 comprising a non-dope polysilicon layer 6 and a silicon oxide layer 7 enclosing the polysilicon layer 6 is extended downward from the shallow trench 4 and formed inside the Si substrate 1.

A HBT formation region is enclosed with the deep trench 5 and the subcollector region 2 is formed inside the Si substrate 1 enclosed with the deep trench 5.

A region enclosed with the shallow trench 4 corresponds to a collector region as an active region. And phosphorus ions are implanted into the surface of the Si monocrystal layer 3 isolated by the shallow trench 4 to form a $N^+$-type collector extract layer 8.

The trench 4 and the trench 5 are approximately 0.3 μm deep and approximately 2 μm deep respectively.

An intrinsic base region 11 is formed directly on the Si monocrystal layer 3 by epitaxial growth. An extrinsic base region is formed directly on the shallow trench 4 comprising the silicon oxide layer by non-selective growth.

Configurations and functions of these intrinsic base region 11 and extrinsic base region 12 are explained in detail later with reference of FIG. 2.

A silicon oxide layer 13 is formed on the intrinsic base region 11. The silicon oxide layer 13 is provided with an open 121 for partly exposing the surface of the Si Cap layer 112 which is a top layer of the intrinsic base region 11 (see FIG. 2). And an emitter electrode 16 is formed in contact with the surface of the Si cap layer 112 via the opening 121. The emitter electrode 16 is an approximately 300 nm-thick layer and comprises $N^+$-type polysilicon which is fixed to be an N-type impurity (phosphorus) of concentration of approximately 1 to $5 \times 10^{20}$ cm$^{-3}$. Further, sidewalls 18 comprising a silicon oxide layer are arranged along sides of the emitter electrode 16, thereby the emitter electrode 16 is insulated from the base layer.

An interlayer dielectric 20 deposits over the entire surface of the Si substrate 1 and contact holes are formed in the interlayer dielectric 20 so as to extend from the surface of the interlayer dielectric 20 to the extrinsic base region 12, the emitter electrode 16, and the collector extract layer 8. The first edges of tungsten (W) plugs 21 buried in the contact holes 21 are electrically connected to metal wiring 22 disposed on the interlayer dielectric 20 and the second edges of the W plugs 21 are electrically connected to the extrinsic base region 12, the emitter electrode 16, and collector extract layer 8.

A Co (cobalt)silicide layer 19 is formed on the surfaces of the extrinsic base region 12, the emitter electrode 16, and the collector extract layer 8 which are connected to the W plugs 21, thereby reducing contact resistance between the W plugs 21 and these layers 8, 12 and the emitter electrode 16.

Thus, the SiGe HBT 120 is configured to comprise the Si substrate 1, the subcollector region 2, the Si monocrystal layer 3, the shallow trench 4, the deep trench 5, the collector extract layer 8, the intrinsic base region 11, the extrinsic base region 12, the silicon oxide layer 13, the emitter electrode 16, the sidewall 18, the interlayer dielectric 20, the W plug 21, and the metal wiring 22.

Now, a configuration of the intrinsic base region 11 and the extrinsic base region 12 is described with reference to FIG. 2.

Figure 2:
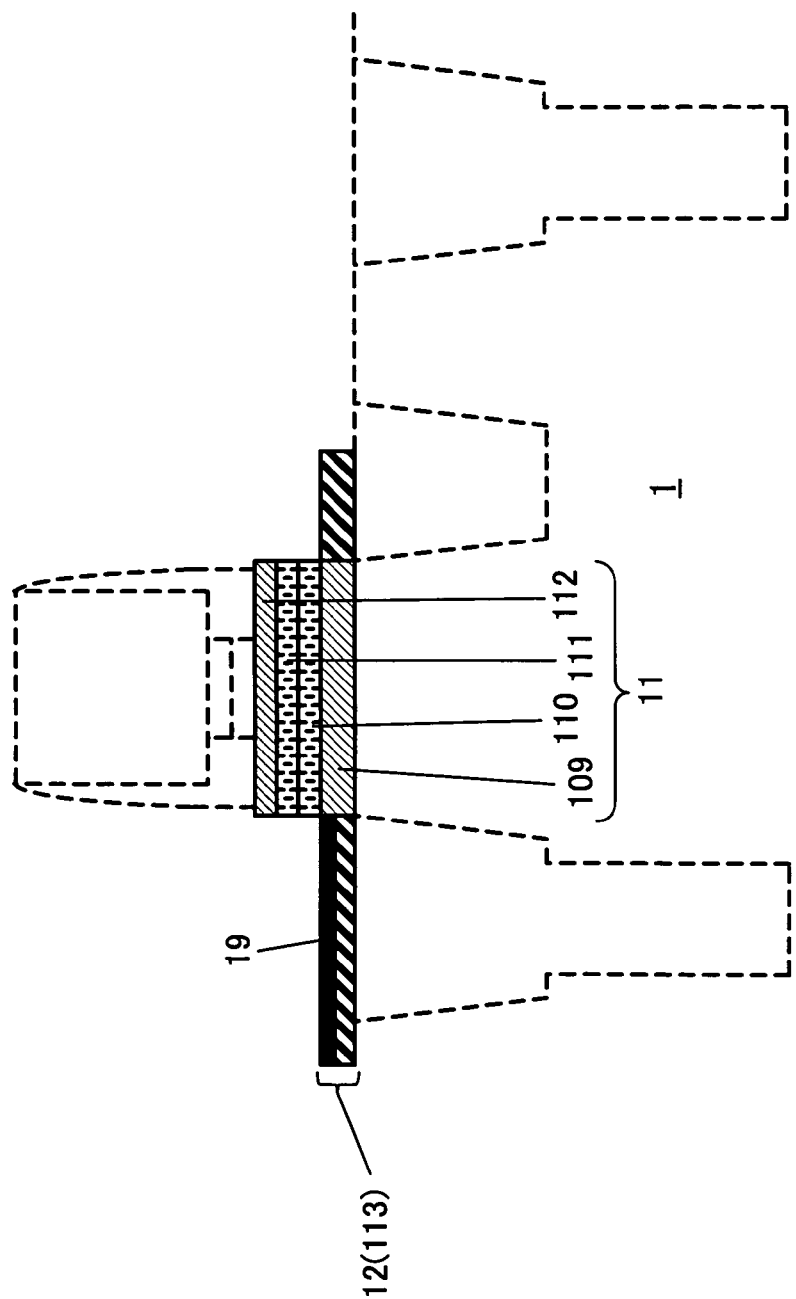
FIG. 2 is a sectional view showing a base layer of the SiGe HBT of the first embodiment in the present invention.

FIG. 2 is a sectional view explaining the configuration of the base layers (the intrinsic base region 11 and the extrinsic base region 12) of SiGe HBT. Other elements except for base layers are abbreviated with dot lines. Although SiGe material is taken as an example here, SiGeC material may be used.

As in FIG. 2, the intrinsic base region 11 comprises a monocrystal Si buffer layer 109 comprised of silicon, a monocrystal non-dope SiGe spacer layer 110 comprised of silicon and germanium, a monocrystal B-dope SiGe graded base layer 111 comprised of silicon and germanium, and a monocrystal Si cap layer 112 comprised of silicon. And these layers 109, 110, 111, 112 are configured to grow on the Si substrate 1 in order upwardly from the Si substrate 1 by a vapor phase growth method (an epitaxial growth method).

The extrinsic base region 12 comprises a polycrystal extrinsic base formation layer 113 comprised of silicon and a Co silicide layer 19 whose surface is silicided. These layers 113 and 19 are formed on the Si substrate 1 and are disposed adjacent to the monocrystal Si buffer layer 109 by a non-selective growth method, and thickness of the base formation layer 113 and the Co silicide layer 19 as a whole is substantially equal to that of the Si buffer layer 109.

The Si buffer layer 109 of the bottom layer in the intrinsic base region 11 does not function as device but is purposed to stabilize crystal growth of the non-dope SiGe spacer layer 110, as an upper layer of the Si buffer layer 109. So, thickness of the Si buffer layer 109 of approximately 10 nm to 20 nm is generally considered enough to fulfill its function. However, thickness of the extrinsic base formation layer 113 is required to adjust so as to fully silicide the surface of the extrinsic base formation layer 113, thereby the monocrystal Si buffer layer 109 which grows simultaneously with the extrinsic base formation layer 113 should be inevitably same in thickness.

That means the thickness of the extrinsic base formation layer 113 should be at least not less than 40 nm so that the Co silicide layer 19 of the desired thickness can be evenly and stably formed on the surface of the extrinsic base formation layer 113. Particularly, growth state of the Co silicide layer 19 formed on the extrinsic base formation layer 113 is tested based on a parameter of thickness t of the extrinsic base formation layer 113 (t=20 nm, 40 nm, 60 nm). The result showed that in case the extrinsic base formation layer 113 is thin, the Co silicide layer 19 is not evenly formed and that with the thickness of at lease not less than 40 nm, preferably not less than 60 nm, the even Co silicide layer 19 is obtained.

Thus, thickness of the extrinsic base formation layer 113 is required to set to at least not less than 40 nm, preferably not less than 60 nm, and thickness of the Si buffer layer 109 is also required to set to not less than 40 nm, preferably not less than 60 nm accordingly.

As an example of an experiment on growth state of the Co silicide layer, the Si buffer layer corresponding to the extrinsic base formation layer (hereinafter referred to as the extrinsic base formation layer for convenience sake) grows so as to have thickness of 20 nm, 40 nm, and 60 nm on the Si substrate formed with a CVD oxide film of 50 nm thickness. Surfaces of these extrinsic base formation layers with each thickness as prepared above are Co silicided.

Figure 27:
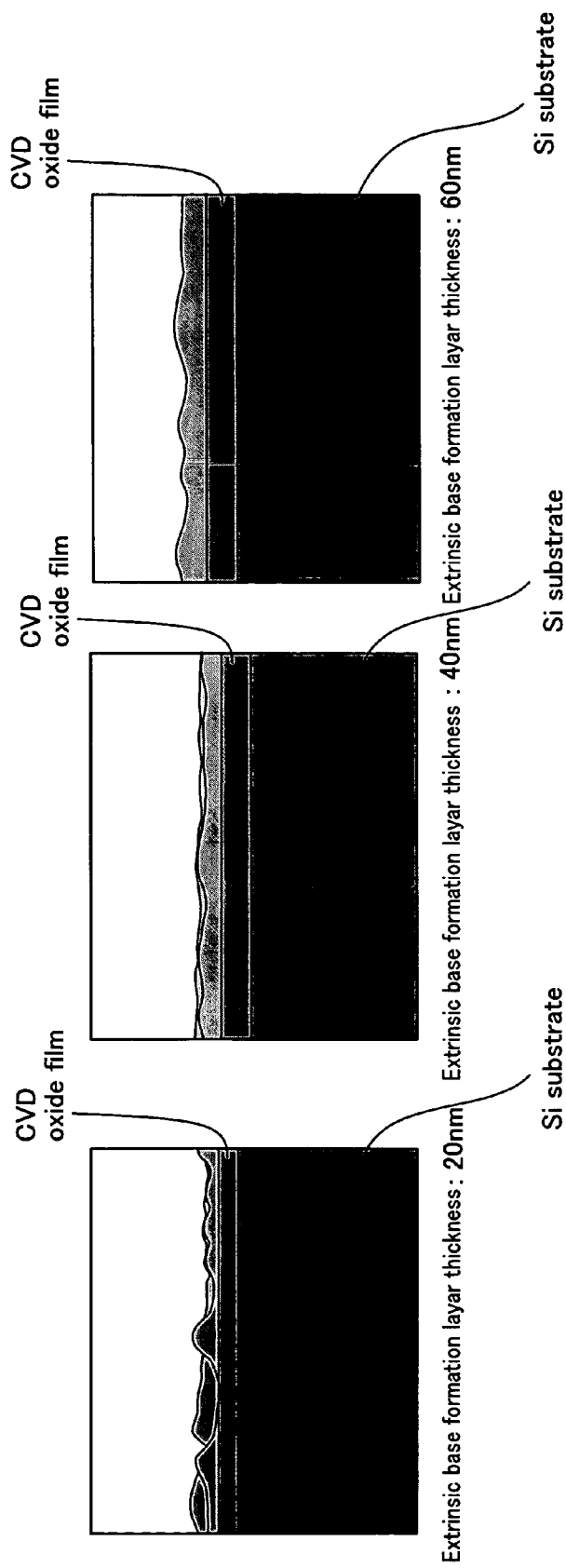
FIG. 27 is schematically showing SEM sectional pictures of Co silicided surfaces of extrinsic base formation layers (20 nm, 40 nm, and 60 nm).
Figure 28:
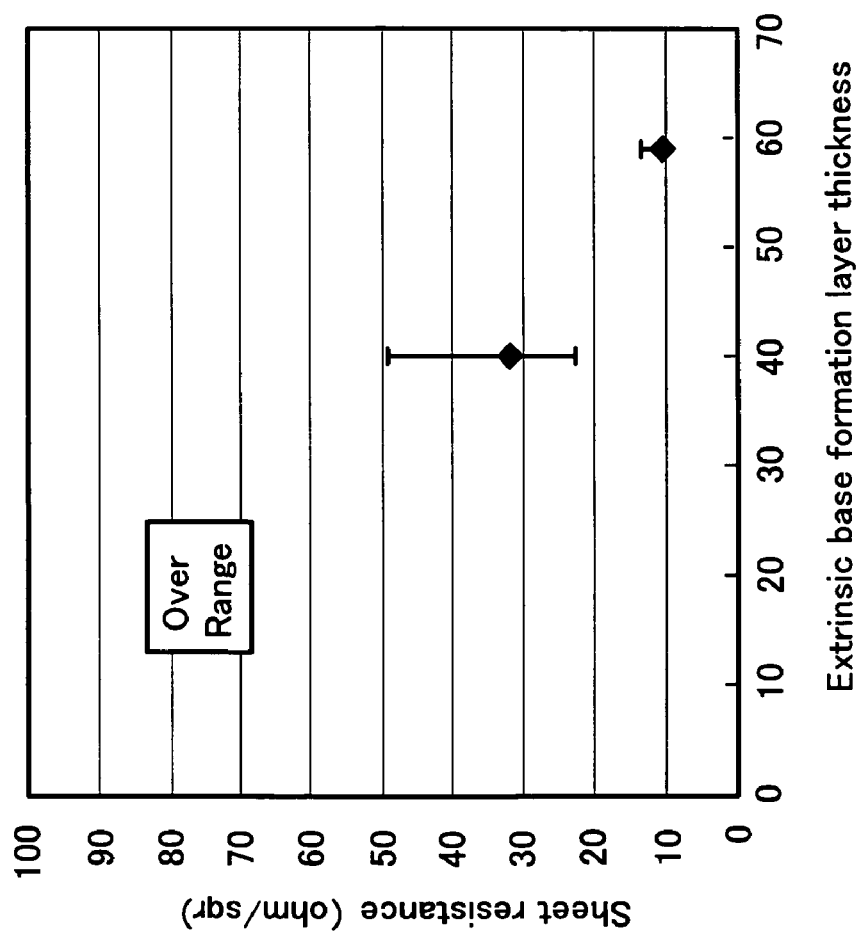
FIG. 28 is a graph showing relation between thickness of an extrinsic base formation layer (represented by a horizontal axis) and sheet resistance of a Co silicide layer (represented by a vertical axis).

FIG. 27 schematically shows sectional SEM pictures of Co silicided surfaces of extrinsic base formation layers (20 nm, 40 nm, and 60 nm). FIG. 28 is a graph showing relation between thickness of the extrinsic base formation layer (represented by a horizontal axis) and sheet resistance of the Co silicide layer (represented by a vertical axis).

In FIG. 27, with the extrinsic base formation layer of 20 nm thickness, the Co silicide surface based on Co silicidation is uneven in an island state (the CVD oxide film of the lower layer is partly exposed). For this reason, sheet resistance of the Co silicide layer in this condition (thickness of the extrinsic base formation layer: 20 nm) is over range as in FIG. 28.

As in FIG. 27, with the extrinsic base formation layer of 40 nm thickness, the lower CVD oxide film is entirely covered with the Co silicide surface based on Co silicidation. Further with the extrinsic base formation layer of 60 nm thickness, the surface of Co silicide surface based on Co silicidation improves flatness. In addition, as in FIG. 28, sheet resistance of the Co silicide layer becomes lower as the extrinsic base formation layer becomes thicker; thereby the film quality is improved.

Based on FIGS. 27 and 28 as described above, it is assured that the experiment result which confirms necessity of setting thickness of the extrinsic base formation layer to not less than 40 nm, preferably not less than 60 nm is obtained.

If thickness of the Si buffer layer 109 exceeds 120 nm, it is not desirable because collector resistance increases. Therefore, a range of desirable thickness of the extrinsic base formation layer 113 and Si buffer layer 109 each is not less than 40 nm and not more than 120 nm, preferably not less than 60 nm and not more than 120 nm.

The non-dope SiGe spacer layer 110 having Ge content of 30% and thickness of 20 nm is formed on the Si buffer layer 109, thereby restricting potential barrier formed on the Si buffer layer 109 which is produced by boron contained in the B-dope SiGe graded base layer 111 of the upper layer and diffused into the Si buffer layer 109.

The B-dope SiGe graded base layer 111 (composition-rate graded base layer) is formed on the non-dope SiGe spacer layer 110. In the B-dope SiGe graded base layer 111, a composition ratio of germanium to silicon varies in its thickness direction, particularly a Ge content decreases from 30% and becomes 0% at the top of B-dope SiGe graded base layer 111, thereby forming gradient of a bandwidth on the base layer to accelerate electrons. Thickness of this B-dope graded base layer 111 is 12 nm and boron (P-type impurity) is added inside the B dope graded base layer 111 by in-site doping so as to make a concentration of $3 \times 10^{19}$ cm$^{-3}$.

The Si cap layer 112 is formed on the B-dope graded base layer 111, thereby restricting diffusion of phosphorus (N-type impurity) contained in the emitter electrode 16 into the B-dope graded base layer 111 to stabilize transistor property.

The Co Silicide layer 19 of the extrinsic base region 12 is formed on the extrinsic base formation layer 113, thereby silicide resistance is not affected by thickness of the Si cap layer 112. It makes the Si cap layer 112 a thinner film (e.g. approximately 5 nm to 10 nm) to further improve a HBT operation speed.

With SiGe HBTs as described above, the Co silicide layer 19 can be formed on the extrinsic base formation layer 113 after the extrinsic base formation layer 113 with a predetermined thick film (e.g. not less than 40 nm) has been formed, thereby the Co silicide layer 19 can be evenly formed on the extrinsic base formation layer 113. In a process of forming the Co silicide layer 19 on the extrinsic base formation 113, silicidation of silicon is not inhibited by Ge atom because no layer containing germanium exists beneath the extrinsic base formation layer 113 to prevent the increase of the silicide resistance assuredly.

Further, because a thickness of the Si cap layer 112 does not affect a resistance of the Co silicide layer 19, the Si cap layer 112 can be made thin and entire thickness of the intrinsic base region 11 can be reduced, thereby electron base transit time is easily reduced.

Next, a method for manufacturing SiGe HBTs 120 in such configuration is explained in detail with reference to drawings.

FIGS. 3 to 14 are sectional views showing a method for manufacturing SiGe HBTs of the first embodiment. FIG. 1 is a sectional view showing the completed SiGe HBT manufactured by the method.

Figure 3:
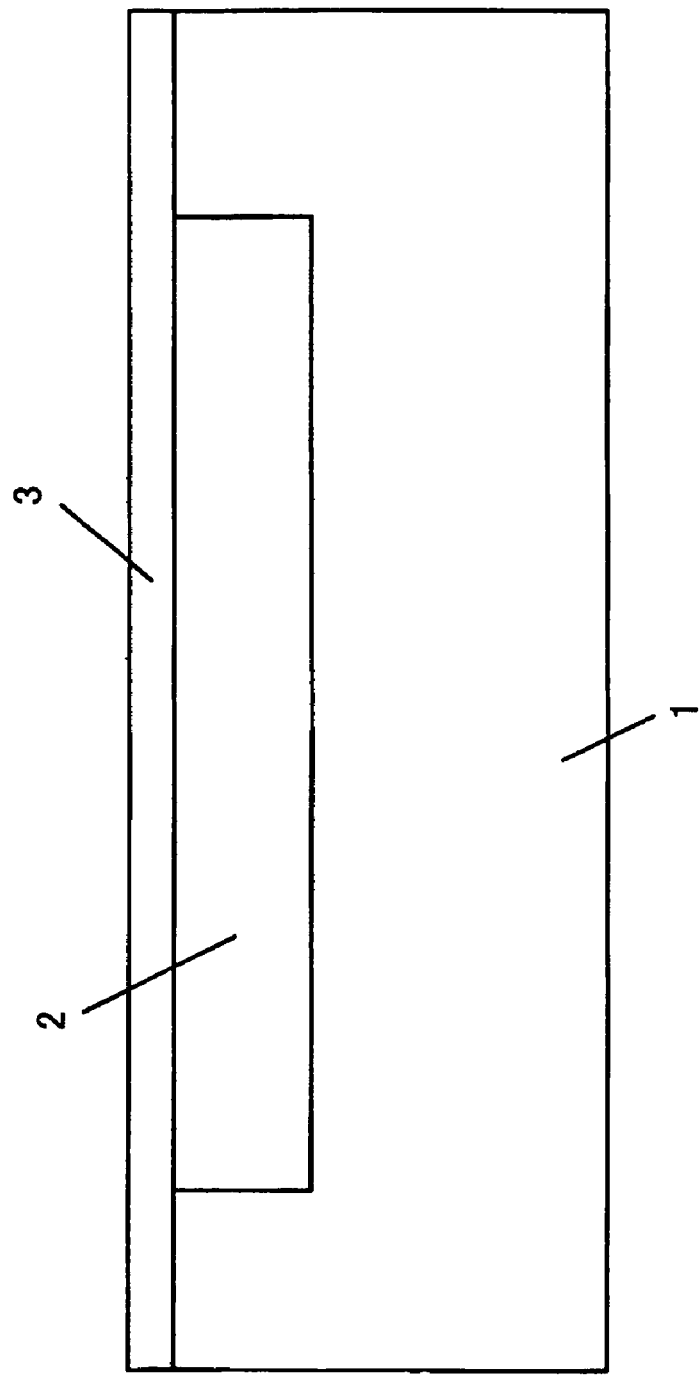
FIG. 3 is a sectional view showing a step of manufacturing the SiGe HBT of the first embodiment.

First, in a process as shown in FIG. 3, using resist opened to form the N-type subcollector 2 by photolithography as a mask, arsenic ions are implanted into an upper surface of the P-type Si substrate 1 to form the N-type subcollector 2 so as to have a depth of 1 µm and an impurity concentration of $1 \times 10^{20}$ cm$^{-3}$ in the HBT formation region.

And then, while N-type impurity is being doped on the Si substrate 1, the Si monocrystal layer 3 epitaxially grows so as to have a thickness of approximately 0.5 µm and an impurity concentration of $1 \times 10^{17}$ cm$^{-3}$.

Figure 4:
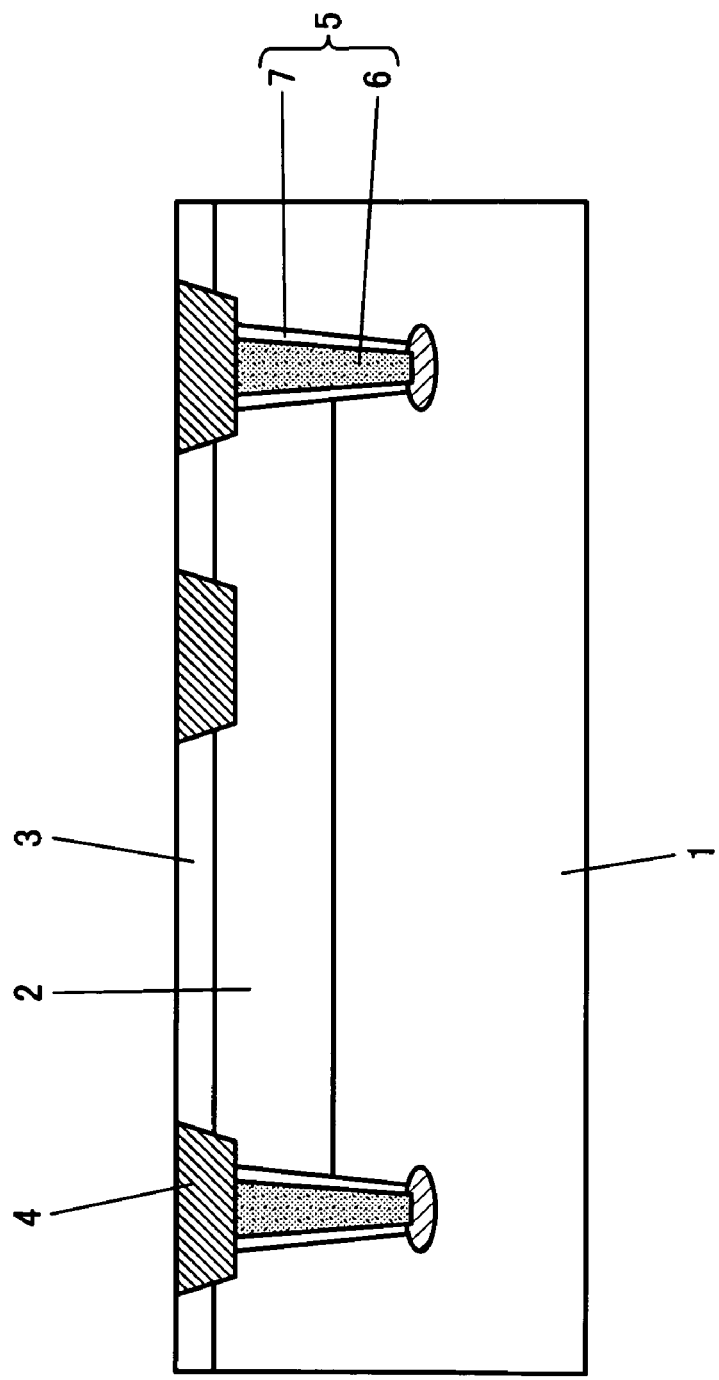
FIG. 4 is a sectional view showing a step following the step of FIG. 3 for manufacturing the SiGe HBT.

Next, in a step shown in FIG. 4, the shallow trench 4 which is buried with the silicon oxide film and the deep trench 5 which comprises the non-dope polysilicon film 6 and the silicon oxide film 7 enclosing the non-dope polysilicon film 6 are formed as the isolation region, thereby the active region is isolated. The trenches 4, 5 have depth of approximately 0.3 µm and 2 µm respectively.

Figure 5:
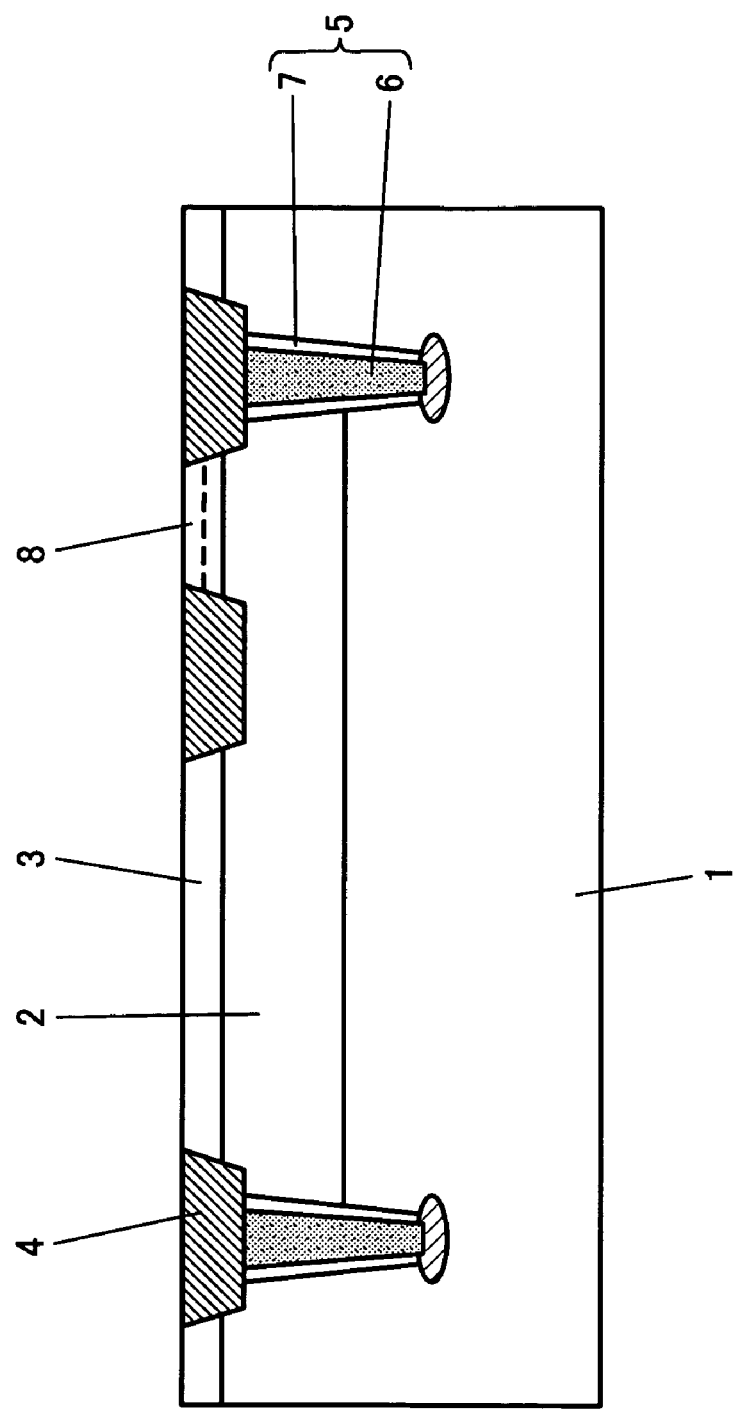
FIG. 5 is a sectional view showing a step following the step of FIG. 4 for manufacturing the SiGe HBT.

Next, in a step shown in FIG. 5, using resist opened for the collector extract layer formation region as a mask, phosphorous ions are implanted into to form the N$^+$-type collector extract layer 8 so as to have an impurity concentration of $5 \times 10^{19}$ cm$^{-3}$.

Figure 6:
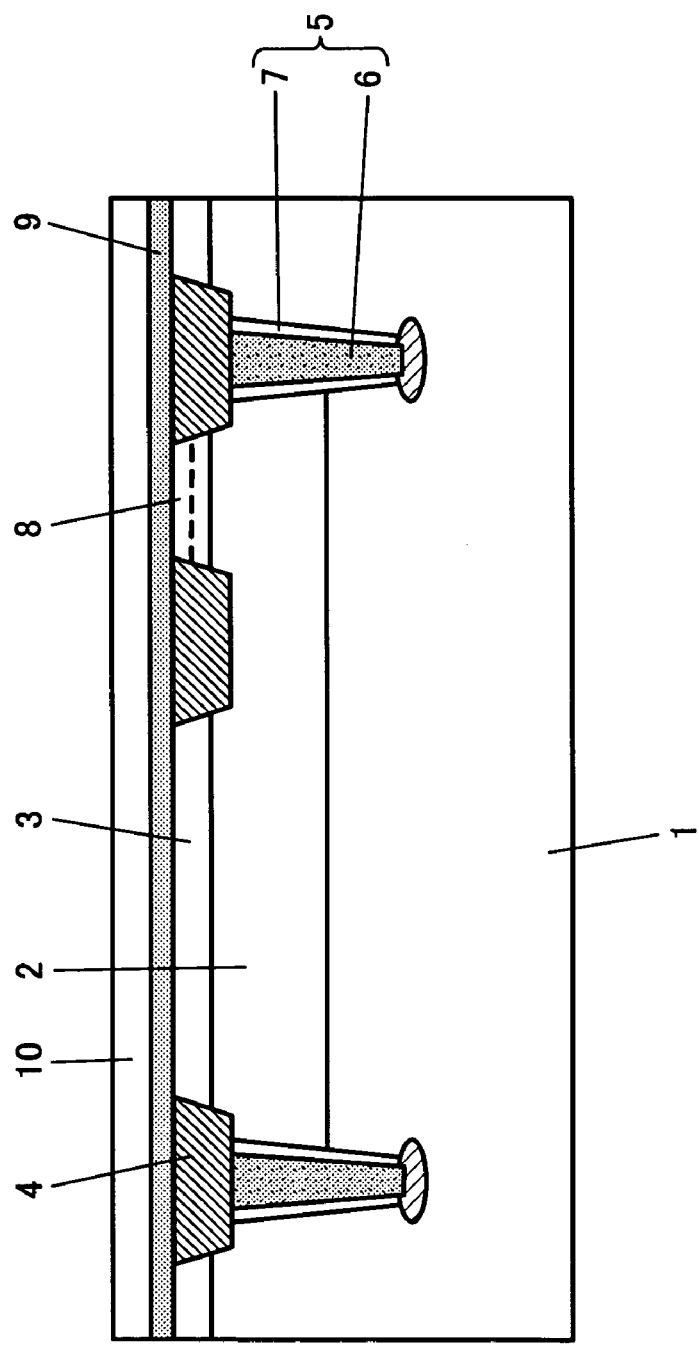
FIG. 6 is a sectional view showing a step following the step of FIG. 5 for manufacturing the SiGe HBT.

Next, in a step shown in FIG. 6, a low pressure CVD method is used to deposit the silicon oxide film 9 of approximately 50 nm and the polysilicon film 10 of approximately 100 nm in this order.

Figure 7:
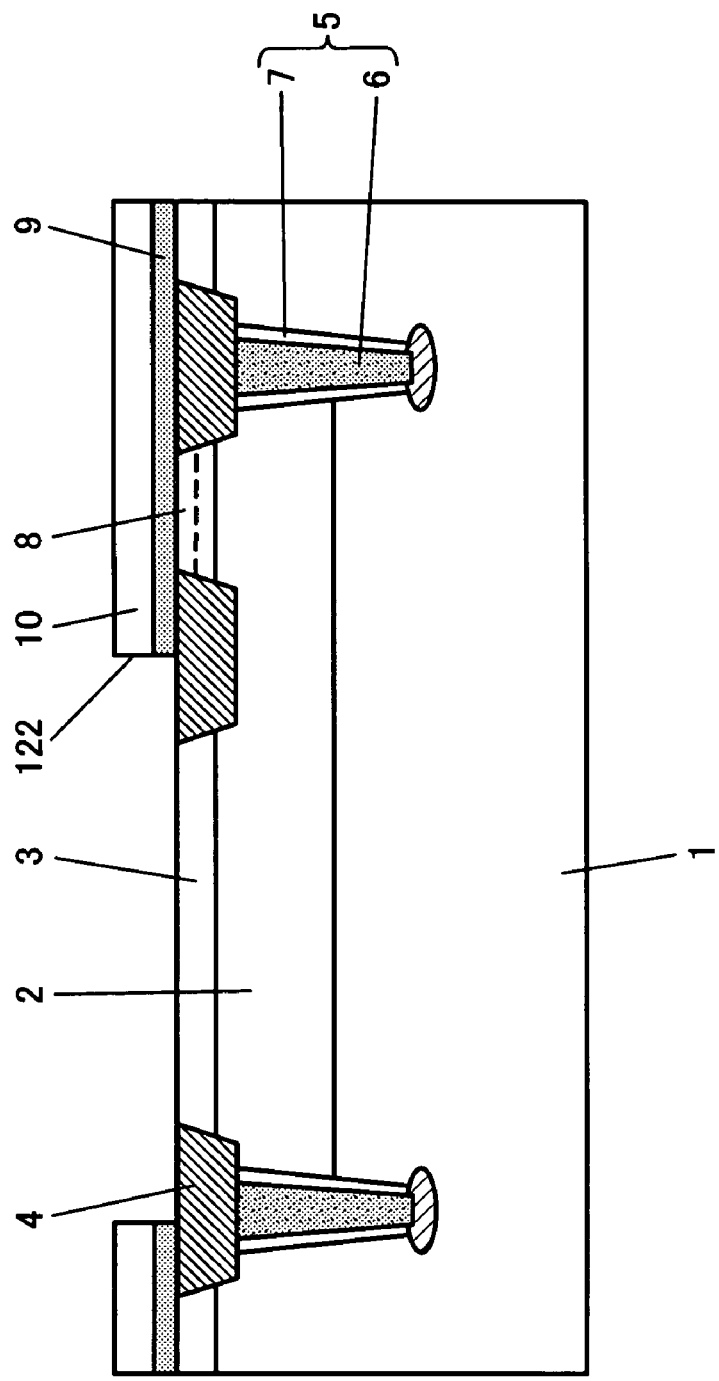
FIG. 7 is a sectional view showing a step following the step of FIG. 6 for manufacturing the SiGe HBT.

Next, in a step shown in FIG. 7, using resist opened to form a collector opening 122 in the HBT formation region by photolithography as a mask, the polysilicon film 10 is removed by a dry etching method to expose a surface of the silicon oxide layer 9 beneath the polysilicon film 10. Thereafter, phosphorus ions are implanted into the silicon oxide layer 9 to form a required phosphorous profile inside the Si monocrystal layer 3.

Then, in order to form the collector opening 122 similar to a region of the exposed silicon oxide film 9, the silicon oxide film 9 is removed to expose a surface of the N-type Si monocrystal layer 3 by a wet etching method using an etchant such as fluorinated acid. Thus, a region including an active region enclosed by the silicon oxide film 9 is formed on the Si substrate 1 as a masking layer having the collector opening 122.

Figure 8:
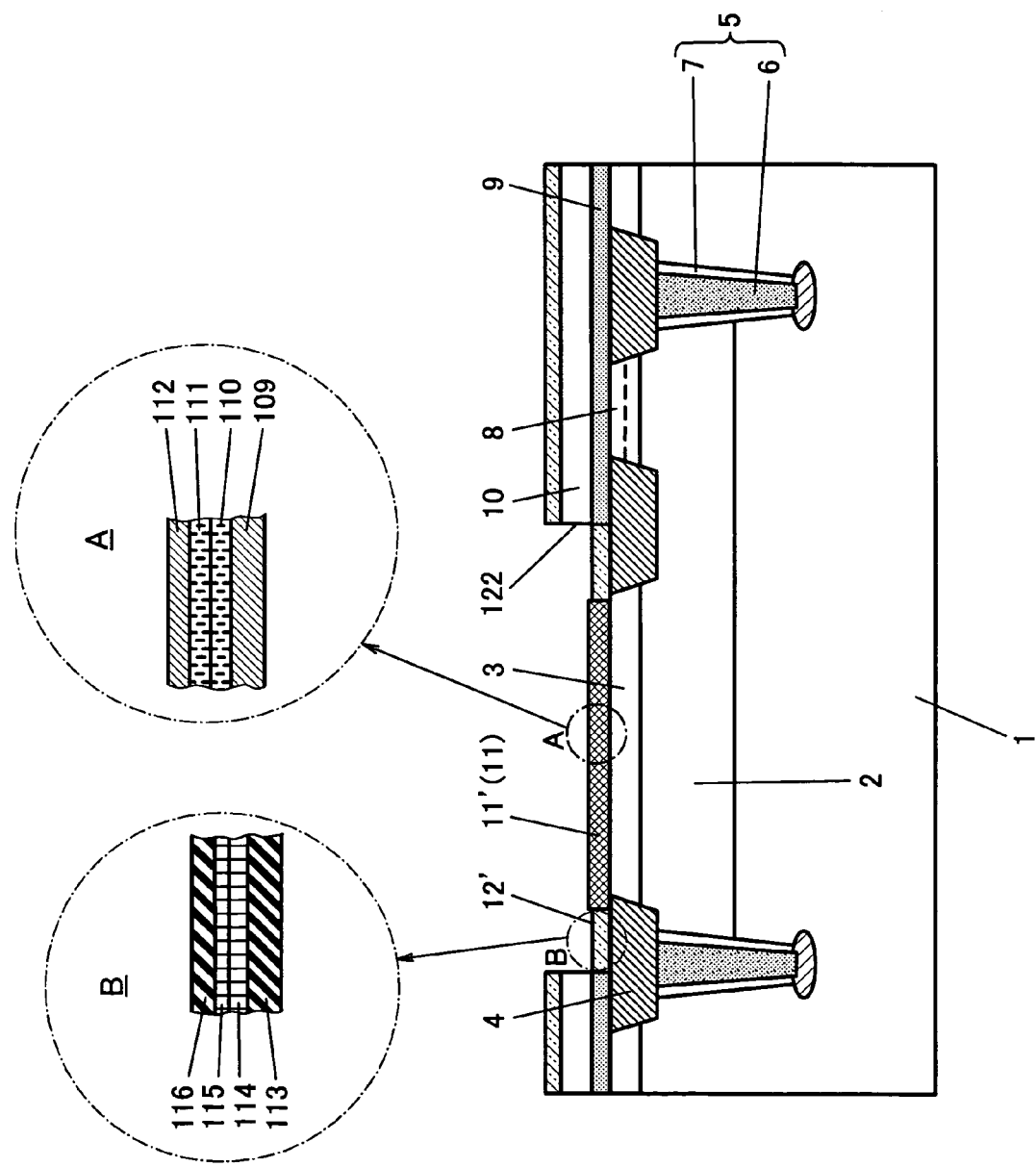
FIG. 8 is a sectional view showing a step following the step of FIG. 7 for manufacturing the SiGe HBT.

Next, in a step shown in FIG. 8, a monocrystal epitaxial SiGe layer 11' (epitaxial base layer) having entire thickness of approximately 100 nm is formed by a chemical vapor phase growth method on the Si monocrystal layer 3 (active region) in the region including the above mentioned active region. Simultaneously, a polycrystal polySiGe layer 12' (polybase layer) is formed by a non-selective growth method on the shallow trench 4 (isolation region) in the region including the above mentioned active region. The polySiGe layer 12' is also formed on the polysilicon film 10.

Here, with regard to the epitaxial SiGe layer 11' and the polySiGe layer 12', boron is doped so as to form these layers with impurity concentration of $3 \times 10^{19}$ cm$^{-3}$ during the growth process. These portions are to be P-type semiconductor. Thus, the intrinsic base region 11 comprising the epitaxial SiGe layer 11' is formed.

As shown in an enlarged view of region A in FIG. 8, the epitaxial SiGe layer 11' has a multiple structure comprising the monocrystal Si buffer layer 109, the monocrystal non-dope SiGe spacer layer 110, the monocrystal B dope SiGe graded base layer 111, and the monocrystal Si cap layer 112. As shown in an enlarged view of region B in FIG. 8, the polySiGe layer 12' has a multiple structure comprising the polycrystal extrinsic base formation layer 113 simultaneously formed with the Si buffer layer 109, the polycrystal second layer 114 simultaneously formed with the non-dope SiGe spacer layer 110, the polycrystal third layer 115 simultaneously formed with the B dope SiGe graded base layer 111, and the polycrystal fourth layer 116 simultaneously formed with the Si cap layer 112.

Figure 9:
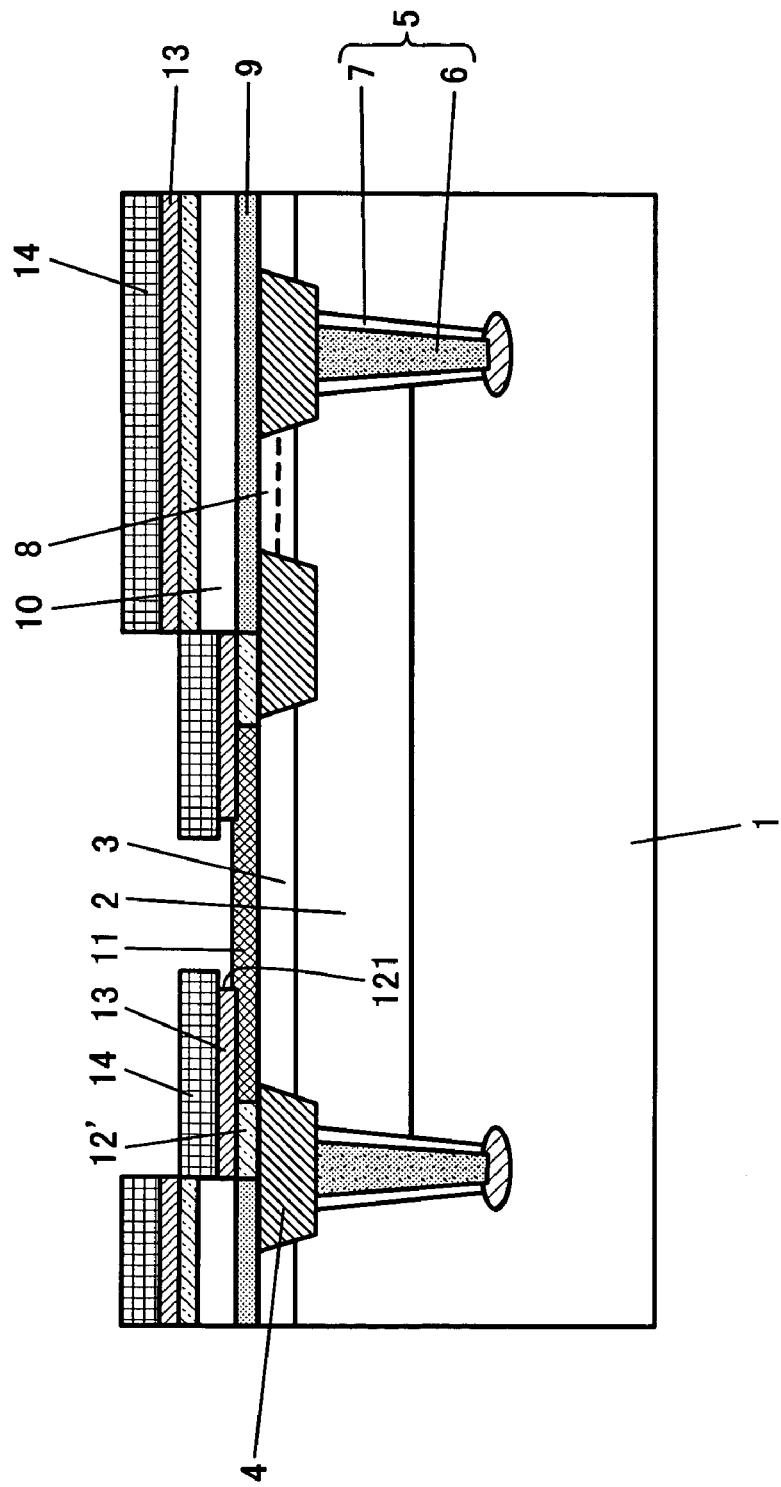
FIG. 9 is a sectional view showing a step following the step of FIG. 8 for manufacturing the SiGe HBT.

Next, in a step shown in FIG. 9, a low-pressure CVD method is continuously used to deposit the silicon oxide film 13 having thickness of approximately 30 nm and the polysilicon film 14 having thickness of approximately 50 nm in this order.

And then, using resist opened an emitter region of the SiGe HBT 120 by photolithography as a mask, and the polysilicon oxide film 14 is removed by a dry etching method to expose a surface of the silicon oxide film 13 beneath the polysilicon oxide film 14. Thereafter, the exposed silicon oxide film 13 is removed by a wet etching method using an etchant such as fluorinated acid to expose a surface of the intrinsic base region 11 beneath the silicon oxide film 13. Thereby, only the intrinsic base region 11 in the opening 121 of the base layer and the emitter layer can be exposed and the other region can be covered with the silicon oxide layer 13.

Figure 10:
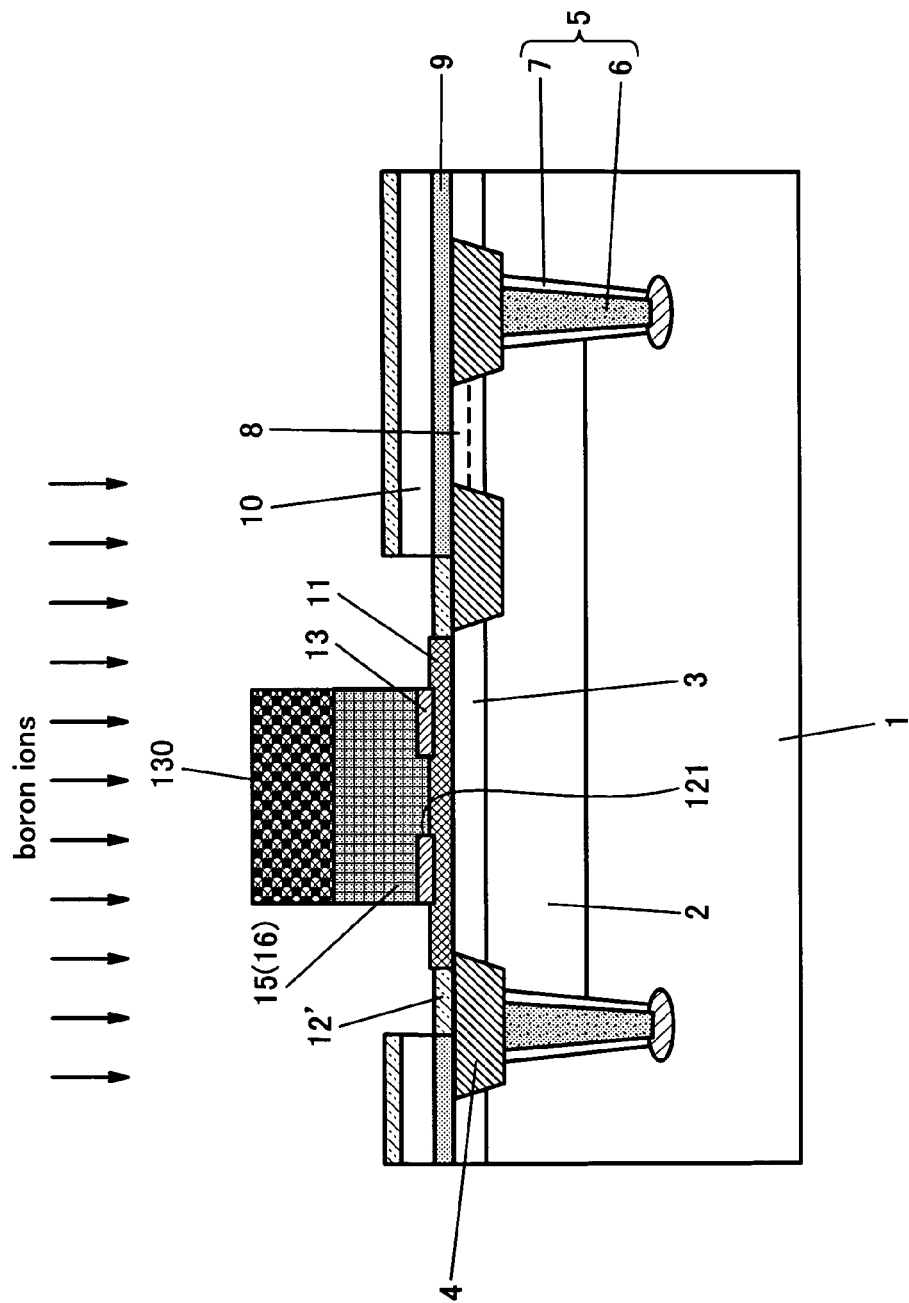
FIG. 10 is a sectional view showing a step following the step of FIG. 9 for manufacturing the SiGe HBT.

Next, in a step shown in FIG. 10, a low-pressure CVD method is used to deposit the N+-type polysilicon layer 15 having thickness of approximately 300 nm and an impurity concentration of 1 to $5\times10^{20}$ cm$^{-3}$ in contact with the intrinsic base region 11 inside the opening 121.

Subsequently, a polysilicon film 15 is removed by an anisotropic dry etching method using resist 130 with the predetermined region opened by photolithography as a mask, thereby forming an emitter electrode 16 comprised of the polysilicon film 15.

Thereafter, the silicon oxide film 13 is removed with this resist 130 as a mask by wet etching process using an etchant such as fluorinated acid.

In order to decrease resistance of the polySiGe layer 12' while keeping the impurity concentration of the intrinsic base region 11 constant and with the resist 130 being left on the emitter electrode 16, impurity (boron) ion is additionally implanted into the polySiGe layer 12' (more properly, the polySiGe layer 12' and a portion of the intrinsic base region not covered with the resist 30) in an arrow direction of the drawing (implantation angel of 0°) so as to form the polySiGe layer 12' having an impurity concentration of $1\times10^{20}$ cm$^{-3}$.

Figure 11:
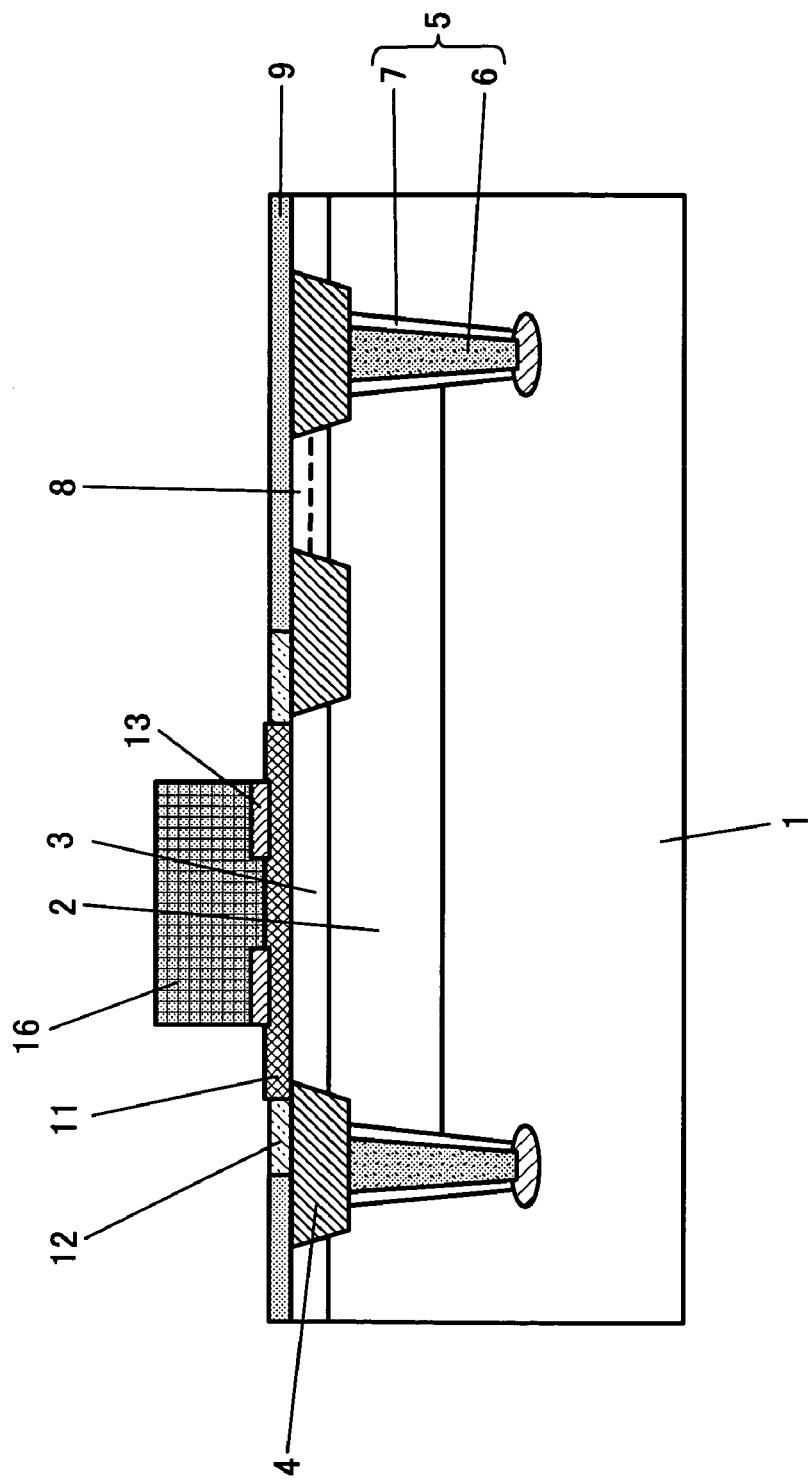
FIG. 11 is a sectional view showing a step following the step of FIG. 10 for manufacturing the SiGe HBT.

Next, in a step shown in FIG. 11, the polysilicon film 10 and the polySiGe layer 12' except for the extrinsic base region 12 are removed by a dry etching method using resist with the predetermined region opened by photolithography as a mask to expose a surface of a silicon oxide layer 9 beneath the polysilicon film 10. Thus, the extrinsic base region 12 comprised of the polySiGe layer 12' is formed on the Si substrate 1.

Figure 12:
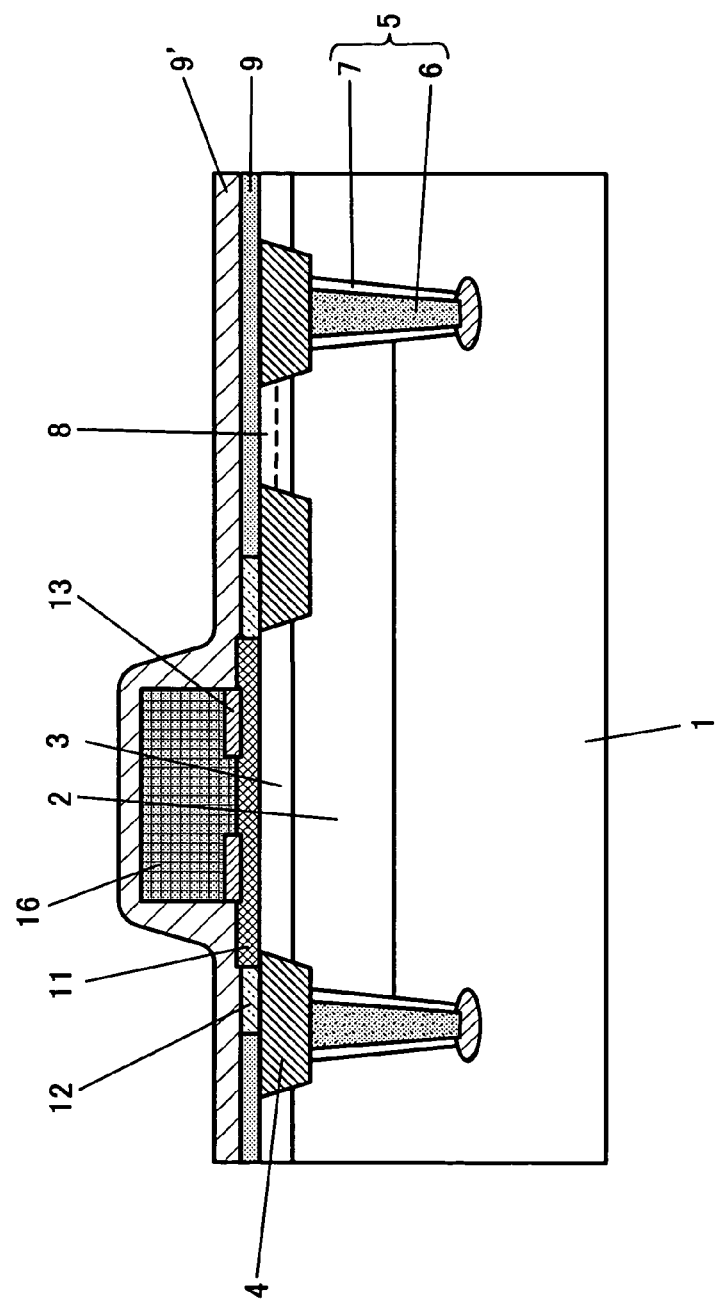
FIG. 12 is a sectional view showing a step following the step of FIG. 11 for manufacturing the SiGe HBT.

Next, in a step shown in FIG. 12, a low-pressure CVD method is used to deposit the silicon oxide film 9' having thickness of approximately 30 to 100 nm. Thereafter, heat treatment is performed at approximately 900° C. for 10 to 15 seconds.

Figure 13:
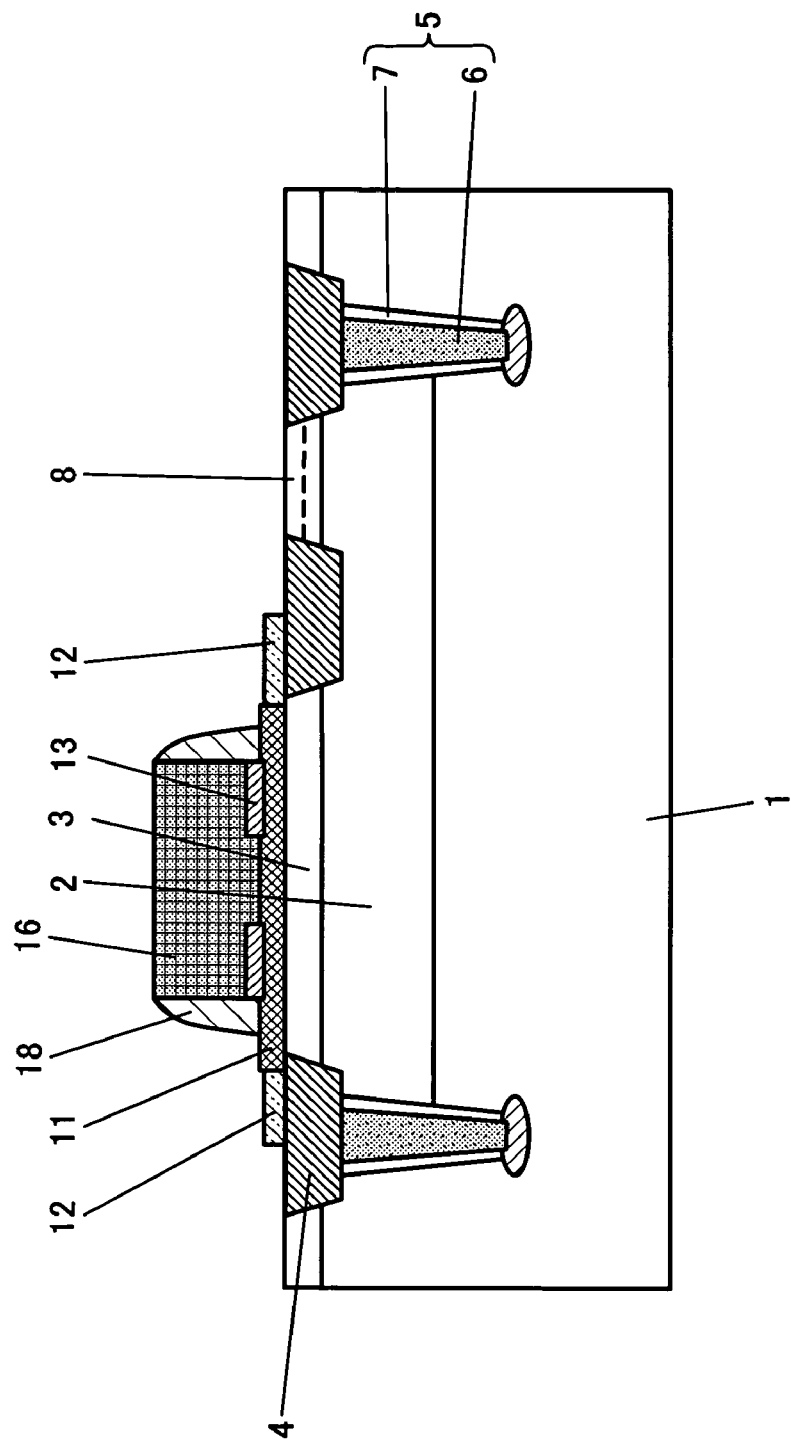
FIG. 13 is a sectional view showing a step following the step of FIG. 12 for manufacturing the SiGe HBT.

Next, in a step shown in FIG. 13, the silicon oxide film 9' and the silicon oxide film 9 beneath the film 9' are etch backed by an anisotropic etching process, thereby forming side walls 18 on the sides of the emitter electrode 16. In this stage, silicon surfaces of the emitter electrode 16, extrinsic base region 12, and the collector extract layer 8 are all exposed.

Figure 14:
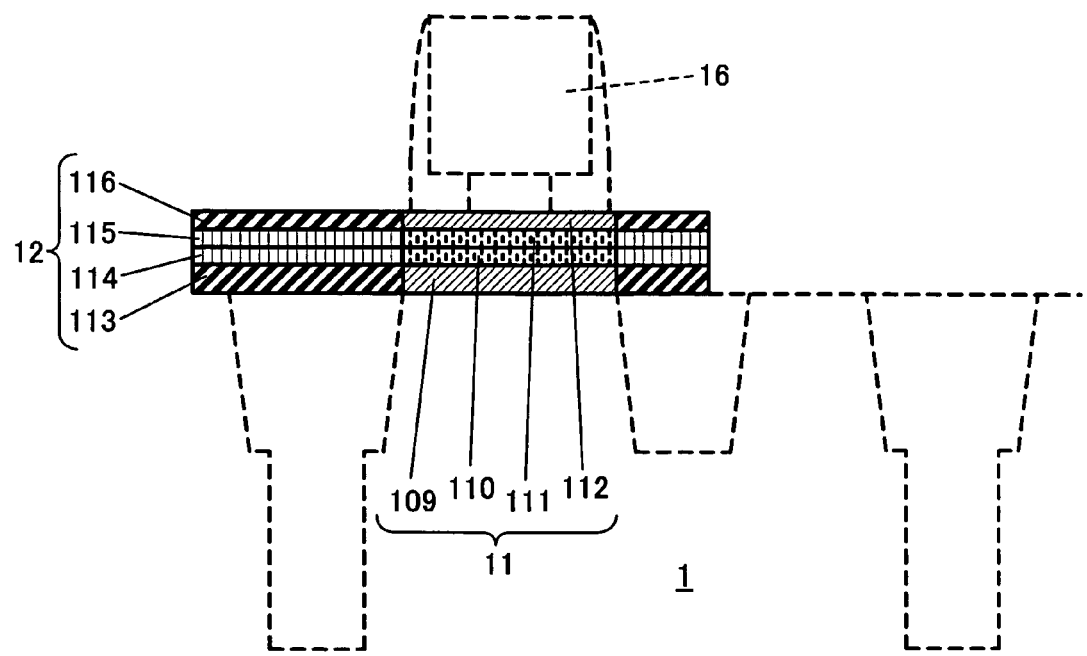
FIG. 14 is a sectional view showing a step following the step of FIG. 13 for manufacturing the SiGe HBT.
Figure 14:
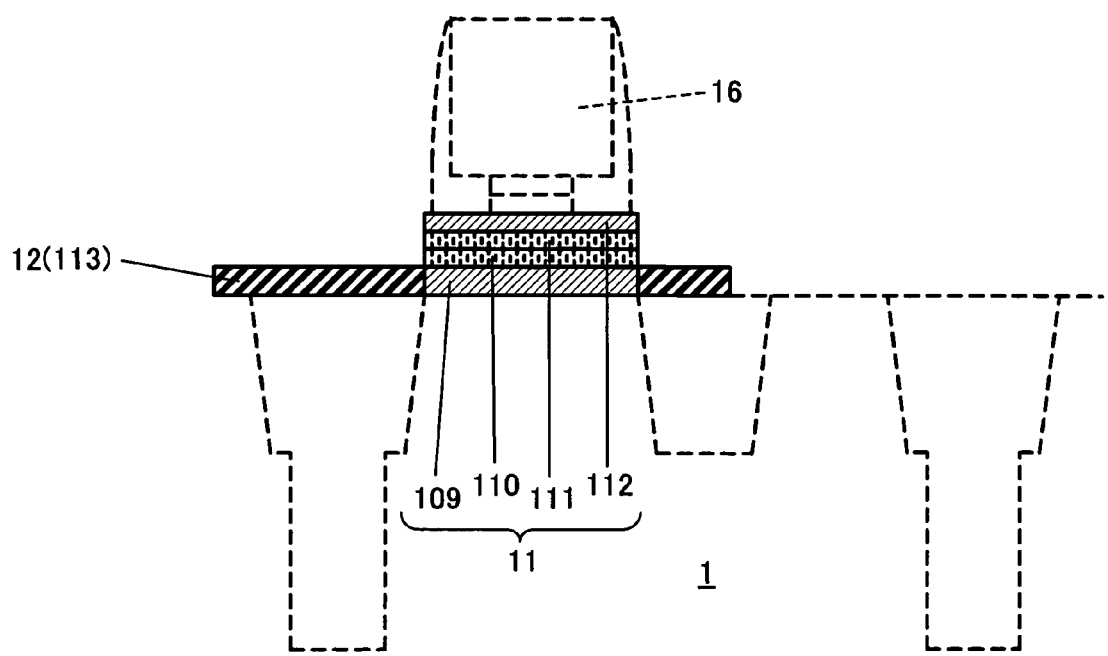

Next, in a step shown in FIG. 14, among a series of processes for manufacturing SiGe HBTs, the process for etching the extrinsic base region 12 is different from the conventional one. Here the process is explained in detail with reference to enlarged views of layer structures of the extrinsic base region 12 and the intrinsic base region 11.

FIG. 14(a) is a sectional view showing the SiGe HBT at the stage before etching process of the extrinsic base region 12, and FIG. 14(b) is a sectional view of the SiGe HBT at the stage after etching process of the extrinsic base region 12.

That is, the extrinsic base region 12 is illustrated to comprise the extrinsic base formation layer (Si layer) 113, and the second layer (SiGe layer) 114, the third layer (SiGe layer) 115 and the fourth layer (Si layer) 116 in order upwardly from the Si substrate 1. The intrinsic base layer 11 is illustrated to comprise the Si buffer layer 109, the non-dope SiGe spacer layer 110, the B dope SiGe graded base layer 111, and the Si cap layer 112 in order upwardly from the Si substrate 1.

Other elements except for these layers are abbreviated with dot line.

In the previous step (FIG. 13), while the surface of the extrinsic region 12 is exposed, the surface of the intrinsic base region 11 is covered with the emitter electrode 16. In this state, the extrinsic base region 12 is wet etched using a mixture of nitric acid ($HNO_3$), water ($H_2O$), and fluorinated acid (HF) as an etchant. An etchant mixture ratio of $HNO_3$:$H_2O$:HF=40:20:5 is desirable.

With the etchant of the mixture ratio, selective etching property between Si and SiGe is excellent. More specifically, the etching speed of Si is 1.8 nm/min, the etching speed of SiGe (30% Ge composition) is 22.5 nm/min. That means the etching speed of SiGe is 13 times higher than that of Si.

Therefore, the third layer (SiGe layer) 115 and the second layer (SiGe layer) 114 in the extrinsic base region 12 are removed fast by etching using the above mentioned etchant. At the stage when the second layer 114 is removed by etching, the etching speed of the lower extrinsic base formation layer (Si layer) 113 is rapidly decreased, thereby it becomes difficult to proceed the etching process for the extrinsic formation base layer 113.

Thus, with appropriate setting of etching time, the third layer 115 and the second layer 114 in the extrinsic base region 12 can be removed fast by etching, while only the extrinsic base formation 113 in the extrinsic base region 122 can be left controllably.

Thereby, as shown in FIG. 14(b), the SiGe HBT left only the extrinsic base formation 113 in the extrinsic base region 12 can be obtained.

Next, in a step shown in FIG. 1, a sputtering method is used to deposit cobalt (Co) on surfaces of the extrinsic base region 12, the emitter electrode 16 and the collector extract layer 8. After annealing treatment is performed, Co unreacted layer is removed. Further, Co silicide layer 19 is formed on surfaces of the extrinsic base region 12, the emitter electrode 16 and the collector extract layer 8 by secondary annealing treatment.

Then, the interlayer dielectric 20 deposits entirely over the Si substrate 1. Thereafter, the interlayer dielectric 20 is provided with three contact holes extending through the interlayer dielectric 20 in its thickness direction and reaching the Co silicide layer 19 of each of the emitter electrode 16, the extrinsic base region 12 and the collector extract layer 8.

Tungsten (W) buried within the contact holes produces W plugs 21. And then, a sputtering method is used to deposit an aluminum alloy film on the interlayer dielectric 20, and the aluminum alloy film is patterned using resist opened in the predetermined region as a mask, thereby forming metal wirings 22 which are connected to the W plugs 21 respectively and extend on the inter layer dielectric 20. Thus, the SiGe HBT 120 as shown in FIG. 1. can be obtained.

According to the method of the first embodiment, among layers of the extrinsic base region 12, the layers containing Ge atom are removed by etching in advance, thereafter the Co silicide layer 19 is formed on the extrinsic base formation layer 113 comprised of Ge atom-free silicon. For this reason, it is ensured that base resistance increase resulting from inhibition of silicidation due to Ge atom can be prevented.

Second Embodiment

Figure 15:
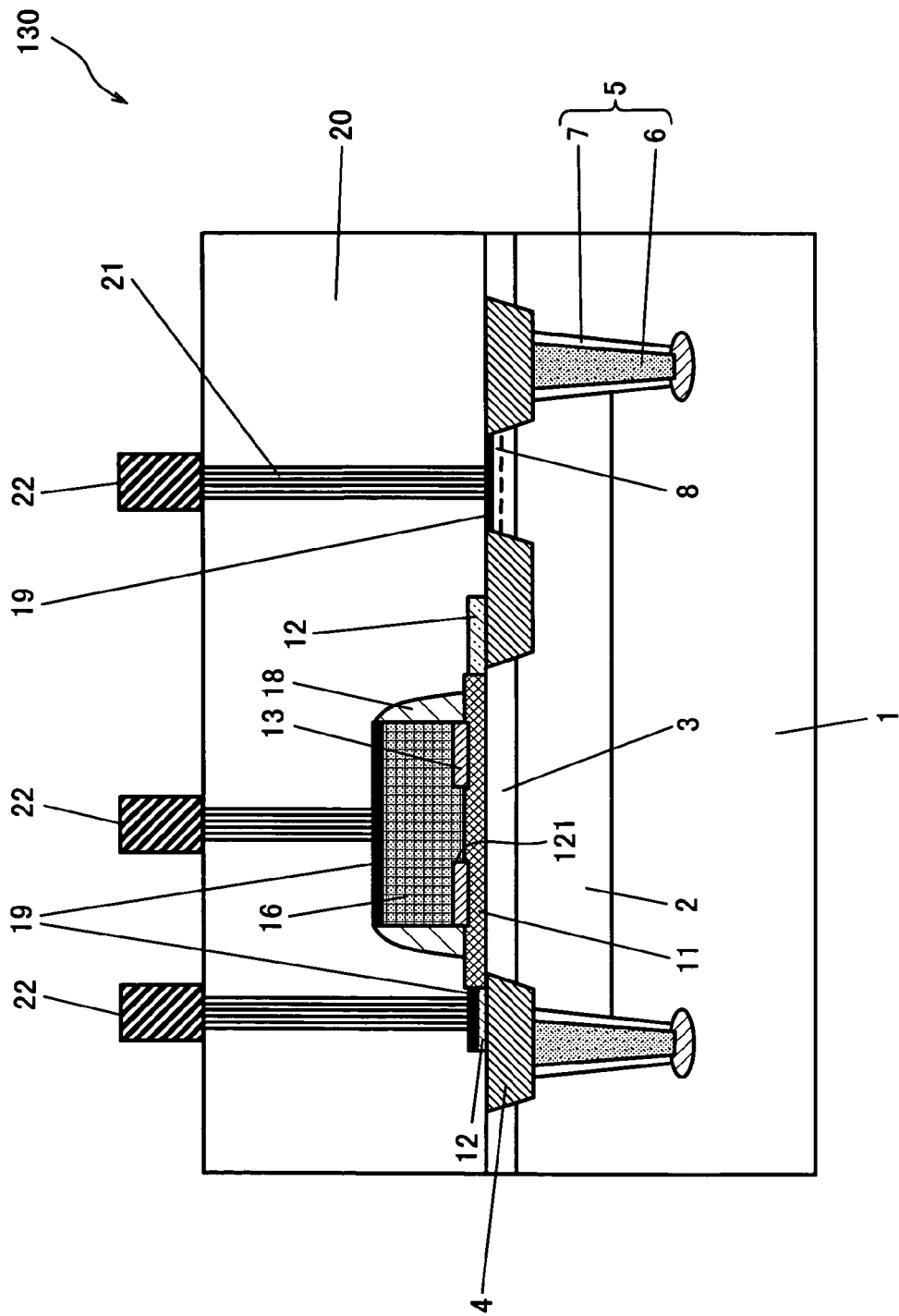
FIG. 15 is a sectional view showing a SiGe HBT of a second embodiment in the present invention.
Figure 16:
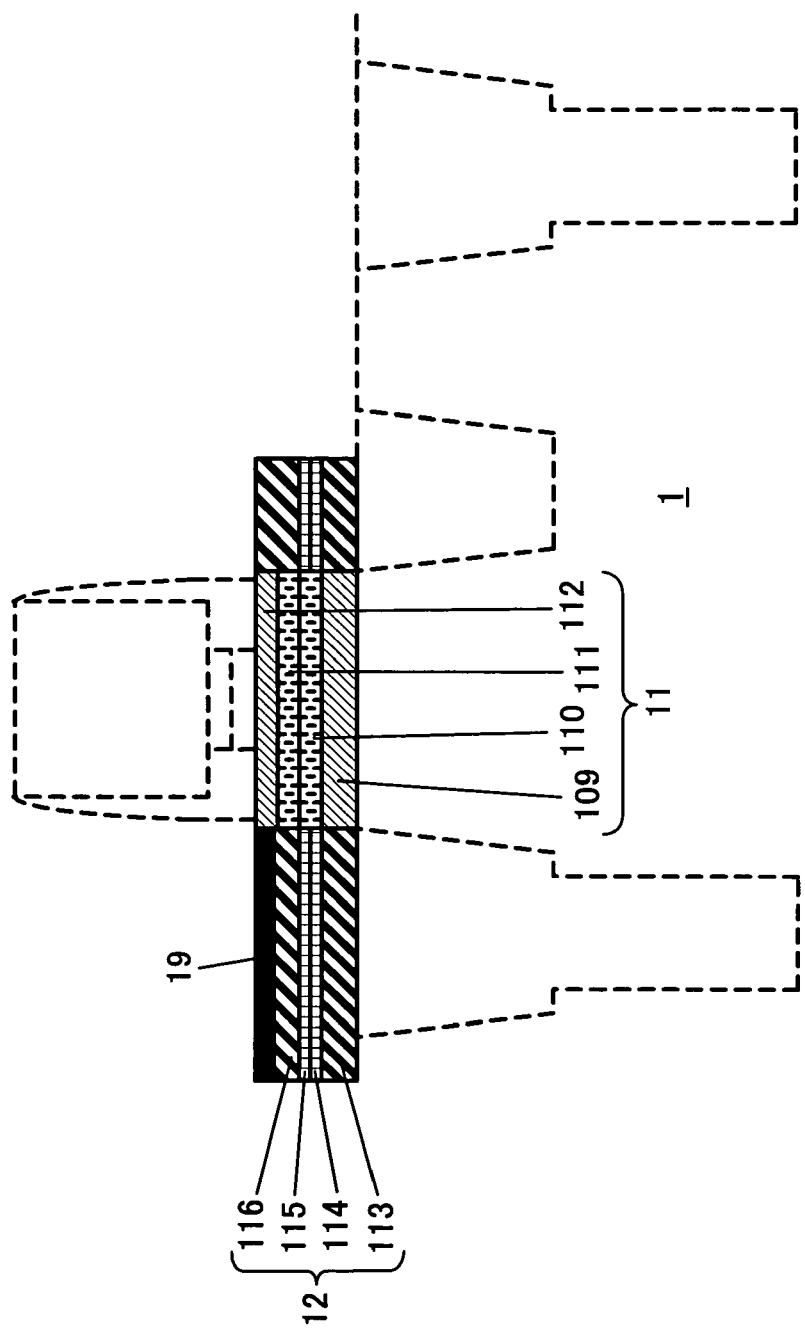
FIG. 16 is a sectional view showing a base layer of the SiGe HBT of the second embodiment in the present invention.

FIG. 15 is a sectional view showing the SiGe HBT of a second embodiment in the present invention. FIG. 16 is a sectional view showing the base layer (the intrinsic base region 11 and the extrinsic base region 12) of the SiGe HBT. Elements but the extrinsic base region 12 is abbreviated with dot lines.

Configurations of the SiGe HBT 130 shown in FIG. 15 except for the extrinsic base region 12 are the same with that of the SiGe HBT 120 of the first embodiment (FIG. 1). Therefore, explanations on common configurations are omitted and the extrinsic base region 12 is explained with reference to FIG. 2.

In FIG. 16, the extrinsic base region 12 comprises the first polycrystal layer 113 as the extrinsic base formation layer, the second polycrystal layer 114 as the extrinsic base formation layer, the third polycrystal layer 115 as the extrinsic base formation layer, the fourth polycrystal layer 116 as the extrinsic base formation layer, and the Co silicide layer 19. These layers 113, 114, 115, 116 are configured to grow on the Si substrate 1 in order upwardly from the Si substrate 1 by a vapor phase growth method. The first layer 113 comprised of silicon, which is disposed adjacent to the monocrystal Si buffer layer 109 and formed simultaneously with the Si buffer layer 109, has thickness of the buffer layer 109 substantially. The second layer 114 comprised of silicon and germanium, which is formed simultaneously with the monocrystal non-dope SiGe spacer layer 110, has approximately 1/10 thickness of the non-dope SiGe spacer 110. The third layer 115 comprised of silicon and germanium, which is formed simultaneously with the monocrystal B-dope SiGe graded base layer 111, has approximately 1/10 thickness of the B-dope SiGe graded base layer 111. The fourth layer 116 comprised of silicon is formed simultaneously with the monocrystal Si cap layer 112. A surface of the fourth layer 116 is silicided to form the Co silicide layer 19.

The fourth layer 116 is set to have a thickness required for forming the Co silicide layer 19 (e.g. 60 nm) thereof.

Thickness of the second layer 114 and the third layer 115 can be controlled by growth because these layers 114, 115 grows while adding reactant gas containing chlorine as described later.

With the above-mentioned SiGe HBT 130, the Ge atom-containing layers configuring the extrinsic base region 12 (specifically, the second layer 114 and the third layer 115) are thinned, which decreases a content of Ge atom of the extrinsic base region 12. Thereby, factors of inhibition of silicidation resulting from the Ge atom are appropriately eliminated during the process of forming the Co silicide layer 19 on the surface of the fourth layer 116, and resistance increase of the Co silicide layer 19 can be assuredly prevented.

Next, a method for manufacturing the SiGe HBT 130 in such configuration is explained in detail with reference to drawings.

FIGS. 17 to 22 are sectional views showing a method for manufacturing the SiGe HBT of the second embodiment. FIG. 15 is a sectional view showing the completed SiGe HBT manufactured by the method.

Because the content of the manufacturing steps of the first embodiment shown in FIGS. 3 to 7 is same with that of the second embodiment, illustration and explanation with regard to these manufacturing steps are omitted.

Figure 17:
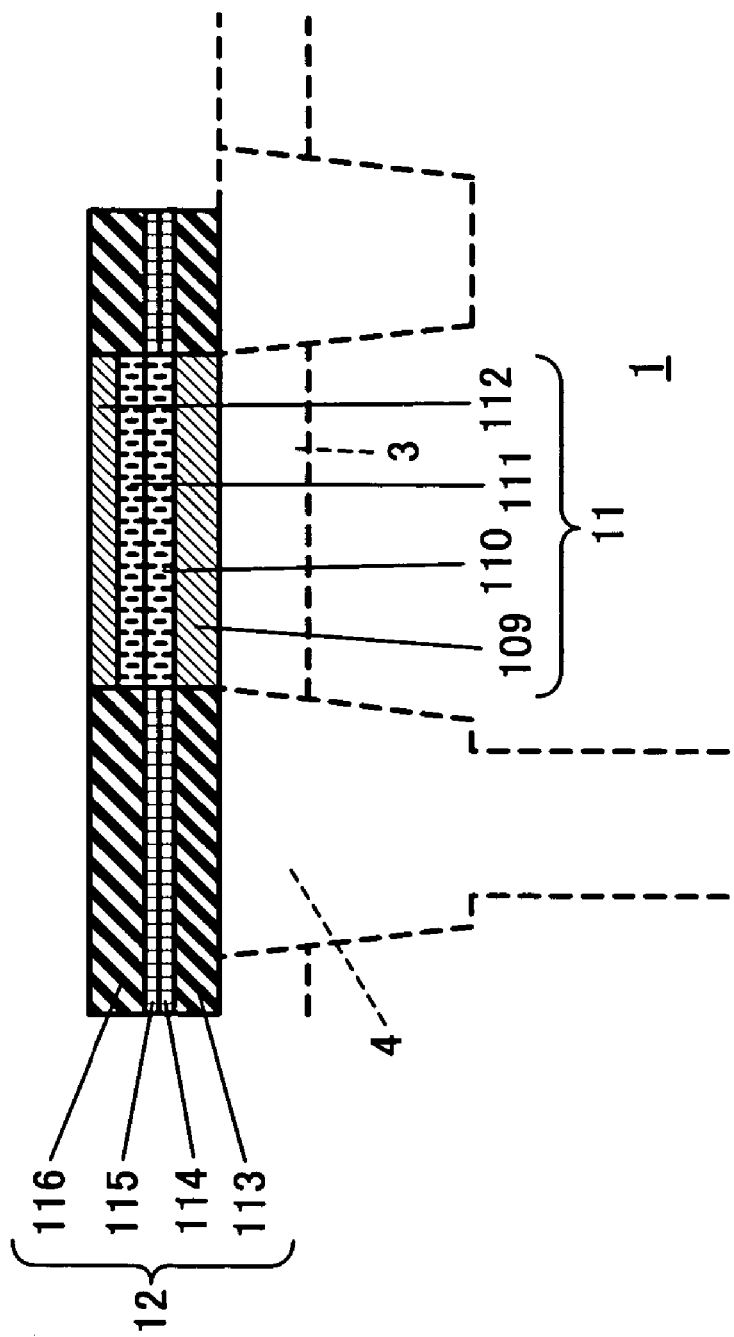
FIG. 17 is a sectional view showing a step of manufacturing the SiGe HBT of the second embodiment.
Figure 18:
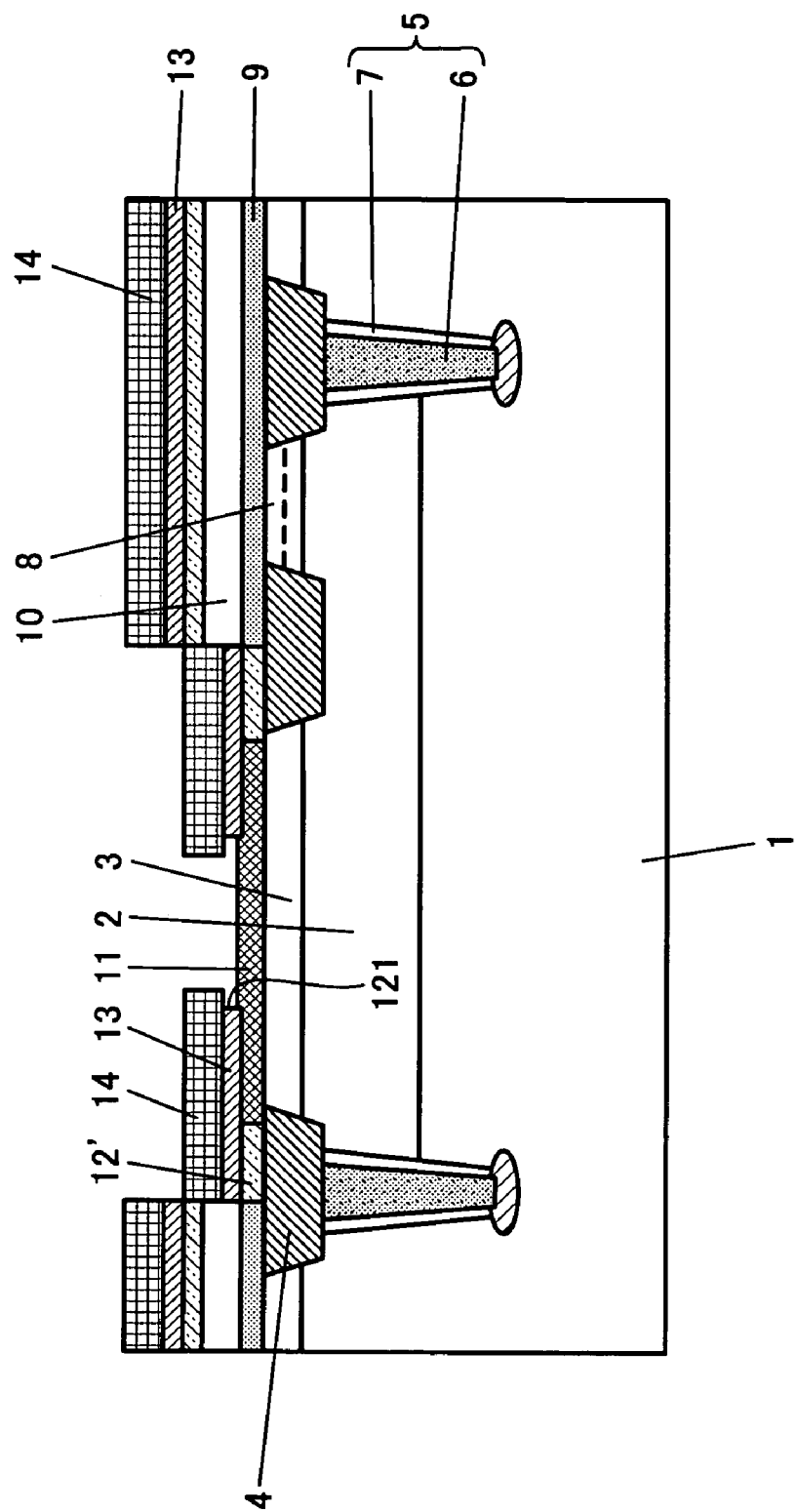
FIG. 18 is a sectional view showing a step following the step of FIG. 17 for manufacturing the SiGe HBT.
Figure 19:
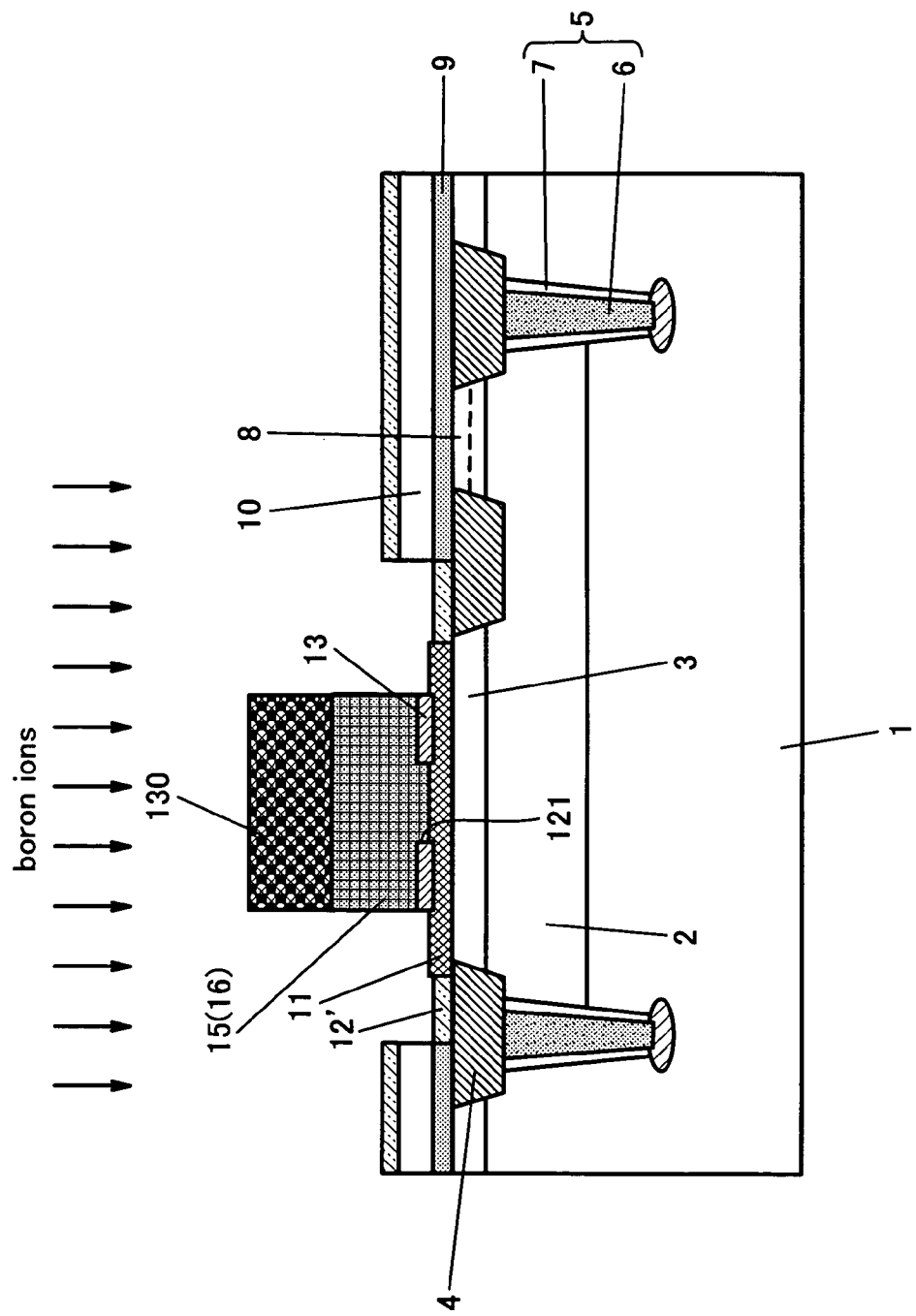
FIG. 19 is a sectional view showing a step following the step of FIG. 18 for manufacturing the SiGe HBT.
Figure 20:
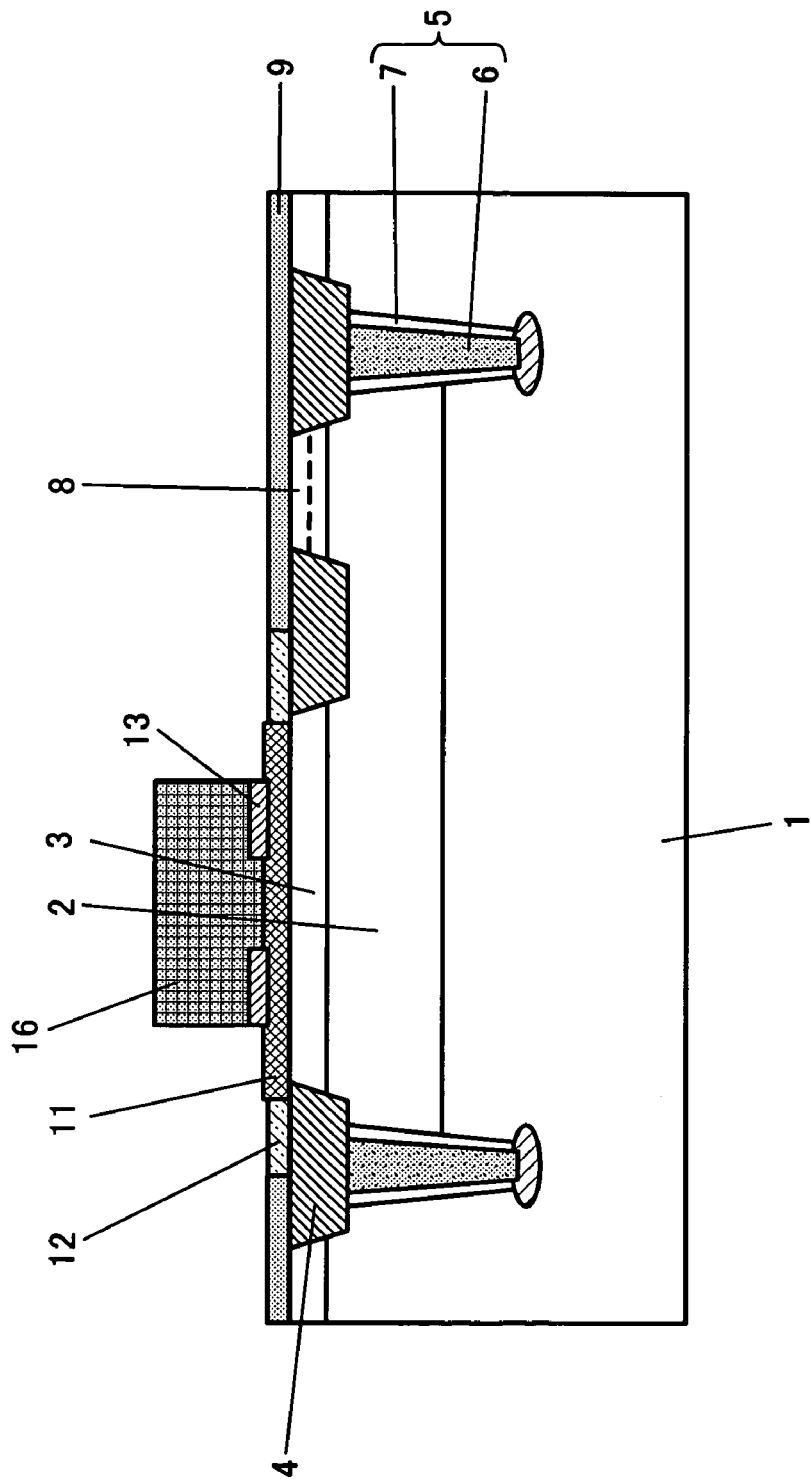
FIG. 20 is a sectional view showing a step following the step of FIG. 19 for manufacturing the SiGe HBT.
Figure 21:
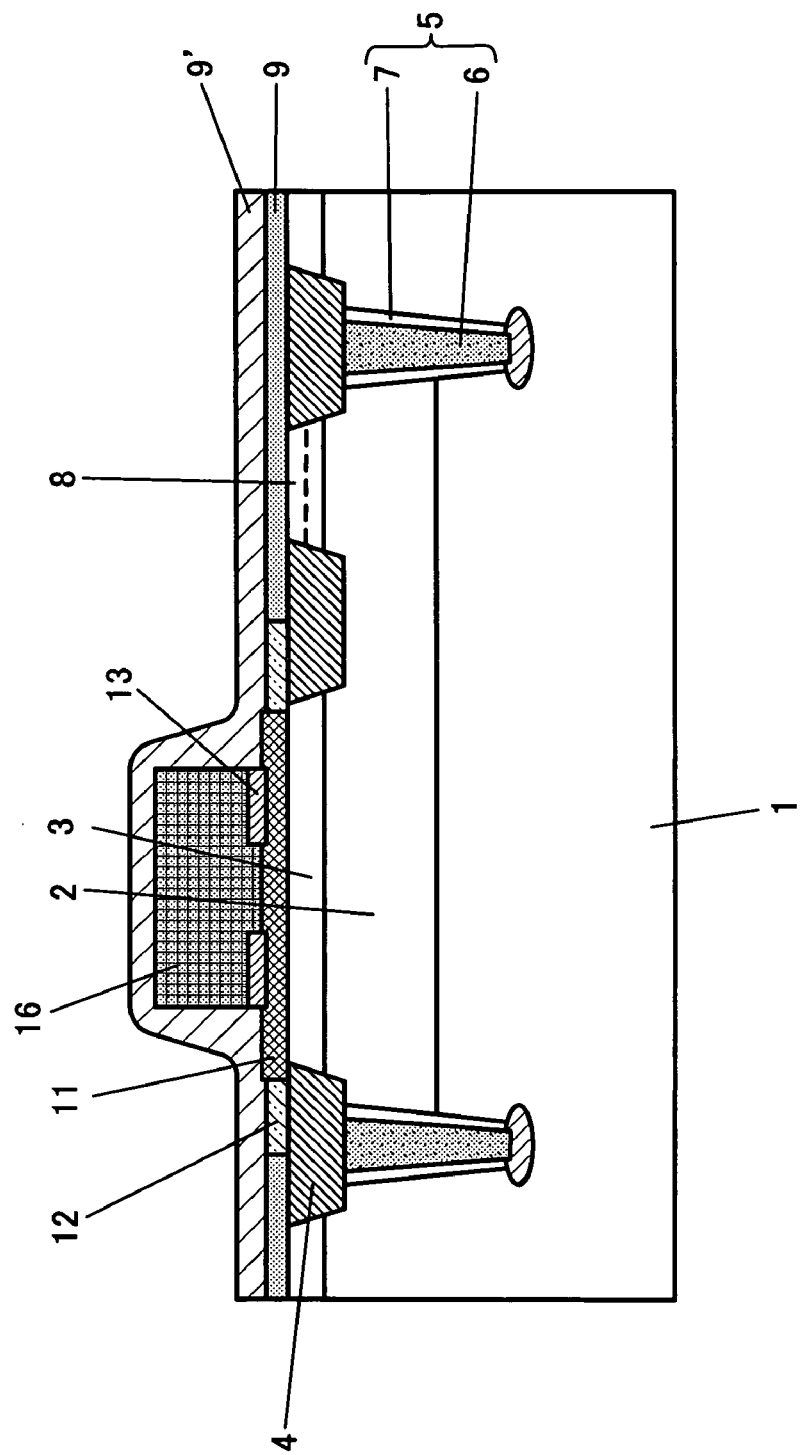
FIG. 21 is a sectional view showing a step following the step of FIG. 20 for manufacturing the SiGe HBT.
Figure 22:
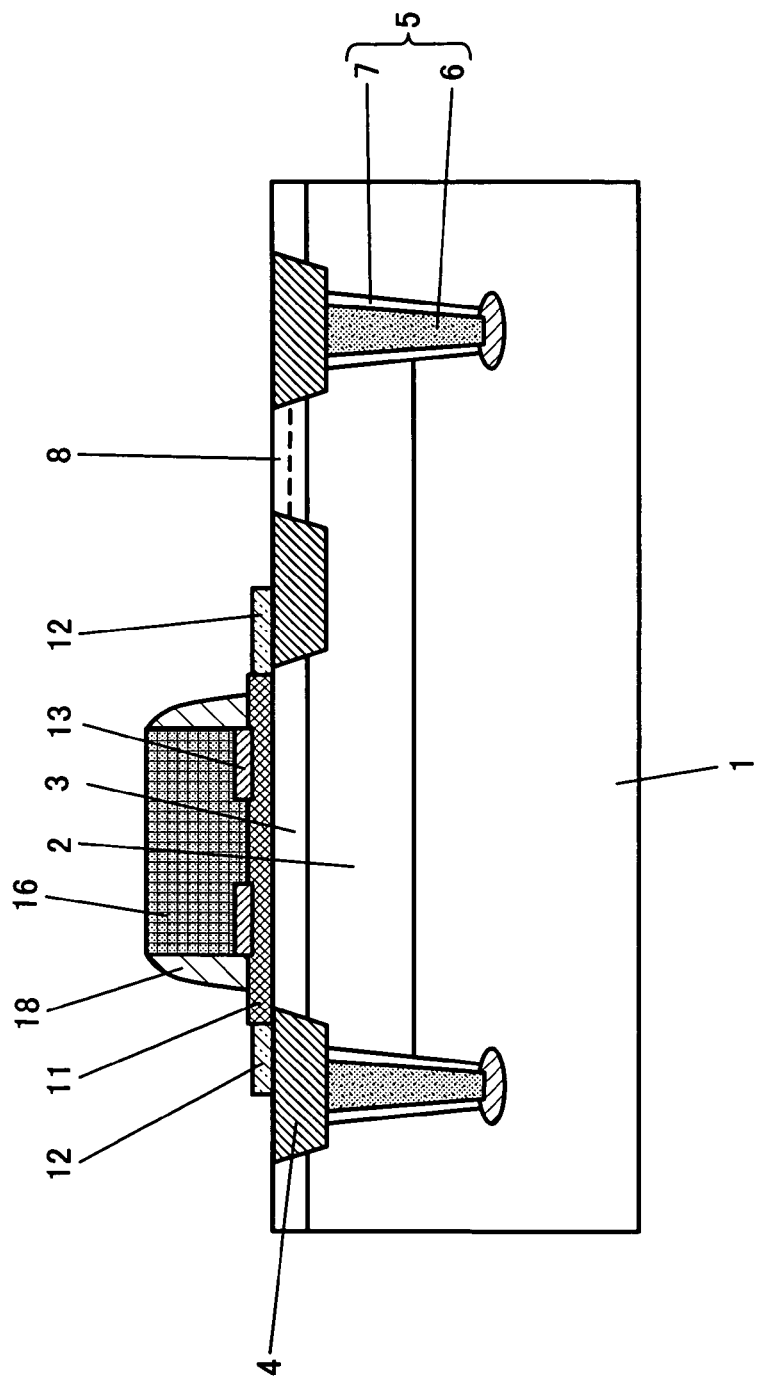
FIG. 22 is a sectional view showing a step following the step of FIG. 21 for manufacturing the SiGe HBT.
Figure 24:
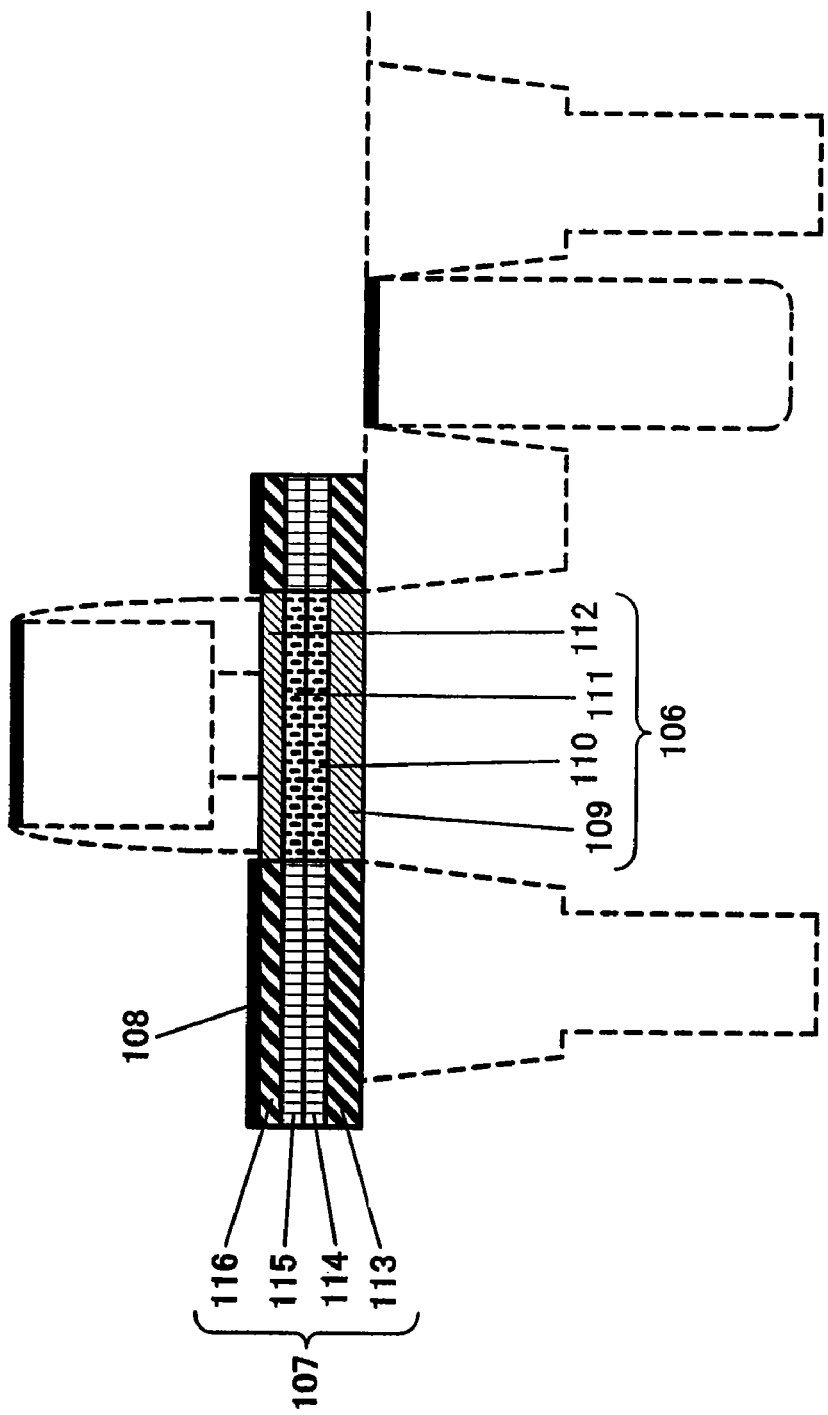
FIG. 24 is a sectional view showing a base layer of the SiGe HBT.
Figure 25:
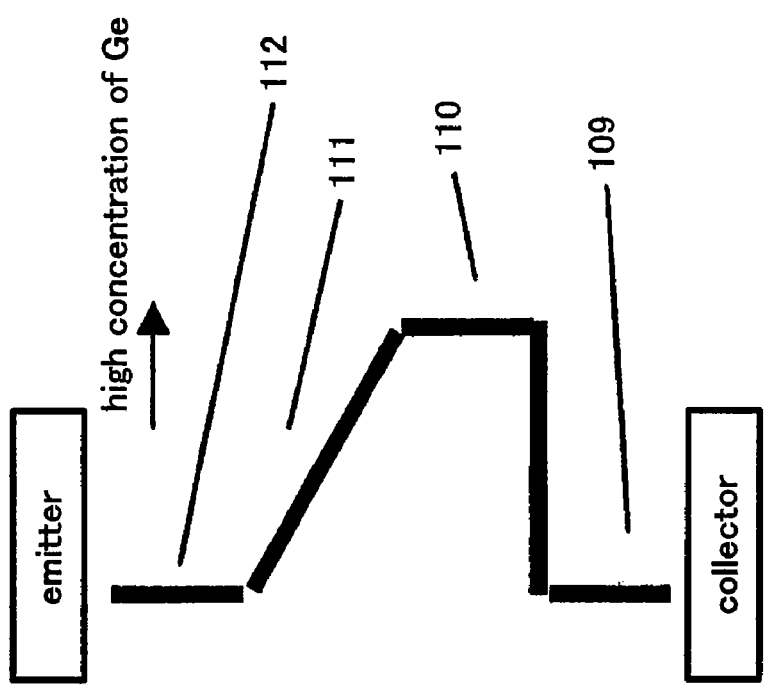
FIG. 25 is a view showing a Ge atom composition profile of the base layer of the SiGe HBT.
Figure 26:
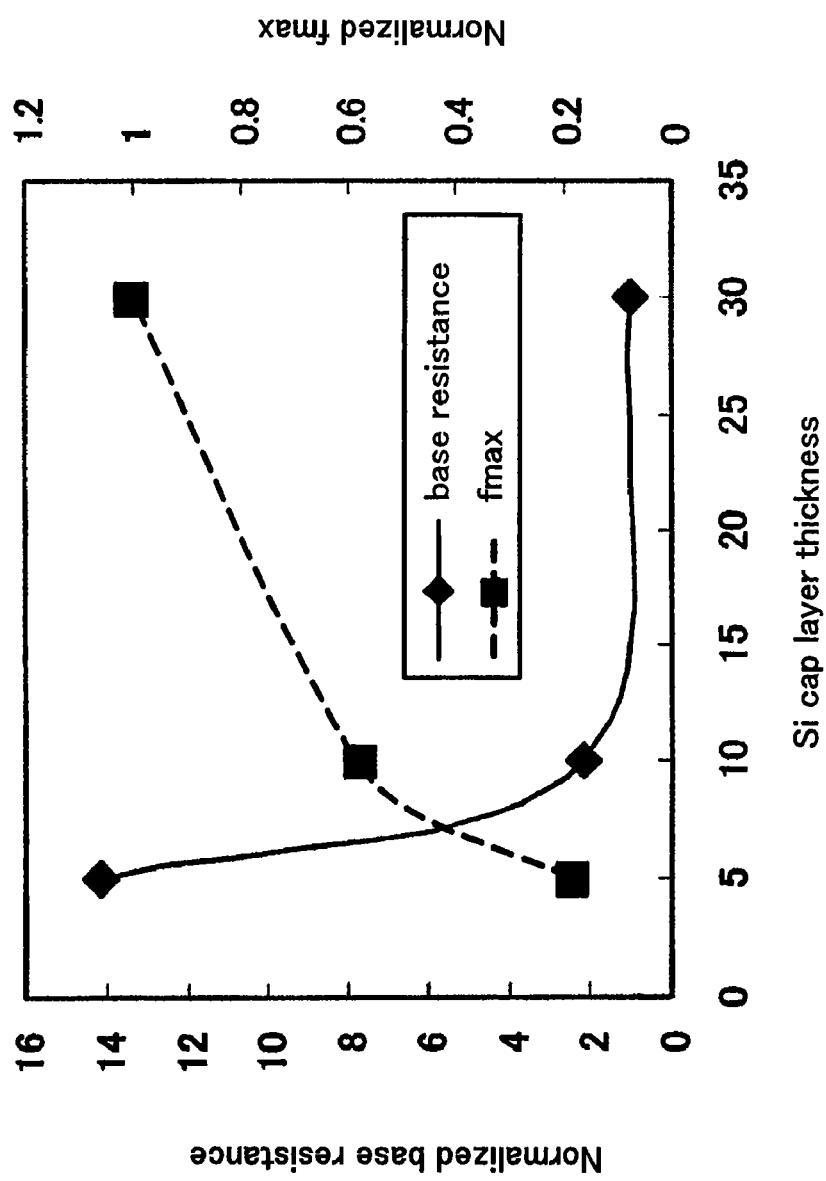
FIG. 26 is showing a data of dependence measurement of the Si cap film thickness with regard to the base resistance and fmax in the conventional SiGe HBT.

In a step as shown in FIG. 17, among a series of steps of manufacturing the SiGe HBT, the extrinsic base region 12 is formed differently from the conventional ones. The manufacturing step is explained in detail with reference to enlarged view showing configurations of the extrinsic base region 12 and the intrinsic base region 11 as in FIG. 17. Elements except for the base layers are abbreviated with dot line in FIG. 17.

The monocrystal Si buffer layer 109 epitaxially grows on the monocrystal Si layer 3 deposited on the Si substrate 1 under the conditions of non-selective growth. More specifically, growth of Si buffer layer 109 is performed under the low growth pressure condition of 80 Torr and temperature condition of 650° C. using $SiH_4$ gas as material gas by a low-pressure chemical vapor phase deposition (LPCVD).

In this case, the first polycrystal layer 113 as the extrinsic base formation layer comprised of silicon grows on the shallow trench 4 simultaneously with growth of the Si buffer layer 109 in the intrinsic base region 11.

Subsequently, the non-dope SiGe spacer layer 110 and B dope SiGe graded layer 11 epitaxially grows on the monocrystal Si buffer layer 109 under the condition of selective growth after shifting from non-selective growth condition to selective growth condition. Specifically, an appropriate amount of gas having etching characteristics such as HCl gas, $Cl_2$ gas, $SiH_2Cl_2$, is added together with material gas ($SiH_4$ gas, $Si_2H_6$ gas, $GeH_4$ gas) and growth of the non-dope SiGe spacer layer 110 and the B-dope SiGe graded base layer is performed under the growth pressure condition of 20 Torr and the temperature condition of 750° C.

Under these selective growth conditions, the monocrystal SiGe layer fast grows on the monocrystal Si buffer layer 109, while the behavior of chlorine-based gas etching inhibits the nucleation of the polycrystal SiGe layer containing silicon and germanium, which makes it difficult for the polycrystal SiGe layer to grow on the first polycrystal layer 113.

For this reason, SiGe layers 114, 115 (the second and third layers as the extrinsic base formation layer) can slightly grow on the first layer 113 of the extrinsic base region 12. However, thickness of these layers 114 and 115 becomes approximately 1/10 of that of the non-dope SiGe spacer layer 110 and the B-dope SiGe graded base layer 111 by the behavior of chlorine-based etching.

Continuously, the monocrystal Si cap layer 112 of the intrinsic base region 11 epitaxially grows under the condition of non-selective growth again, after shifting from selective growth condition to non-selective growth condition. Specifically, using $SiH_4$ gas and the like as material gas, growth of the Si cap layer 112 is performed under the growth pressure condition of 80 Torr and temperature condition of 650° C. and the fourth polycrystal layer 116 comprised of silicon as the extrinsic base formation layer is simultaneously formed.

Because the content of the manufacturing steps shown in FIGS. 18 to 22 and FIG. 15 is same with that of the first embodiment, explanations of these steps are omitted.

With manufacturing method of the second embodiment, thickness of the SiGe layer in the extrinsic base region 12 is controlled to form ⅒ thickness of SiGe layer in the intrinsic base region 11 by etching function of reactant gas containing chlorine, thereby Ge content of the extrinsic base region 12 becomes approximately not more than ⅒ that of the intrinsic base region 11. Accordingly, the extrinsic base region 12 can be configured substantially only by Si material.

Thus, the Co silicide layer 19 (ref. FIG. 15) is formed on the fourth layer containing few Ge atom as the extrinsic base formation layer, thereby securely preventing base resistance increase resulting from inhibition of silicidation due to Ge atom.

Base on the above explanation, improvement and other embodiments of the present invention are clear for people skilled in the art. Therefore, the above explanation should be interpreted just as exemplification and is purposed to teach the best mode to realize the present invention to people skilled in the art. Details of the construction and the function can be practically modified without departing from the spirit of the invention.

INDUSTRIAL APPLICABILITY

According to the bipolar transistor and the method for manufacturing of the present invention, it is possible to eliminate the inhibition factor of silicidation to prevent base resistance from increasing. And it is possible to realize the transistor of high performance, which is useful as a device built in information processing terminals and the like.

What is claimed is:

1. A bipolar transistor comprising:
a substrate;
a intrinsic base region having a silicon buffer layer comprised of silicon which is formed on said substrate, and a composition-ratio graded base layer which is formed on the silicon buffer layer and comprises silicon and at least germanium and where a composition ratio of the germanium to the silicon in the composition-ratio graded base layer varies in a thickness direction of the composition-ratio graded base layer; and
an extrinsic base region having an extrinsic base formation layer comprised of silicon which is formed on said substrate and adjacent to the silicon buffer layer;
wherein a thickness of the extrinsic base formation layer is substantially equal to a thickness of the silicon buffer layer,
each of the extrinsic base formation layer and the silicon buffer layer has a thickness of not less than 40 nm, and
a surface of the extrinsic base formation layer is silicided.

2. The bipolar transistor according to claim 1, wherein the composition-ratio graded base layer is a silicon-germanium graded base layer which comprises silicon and germanium.

3. The bipolar transistor according to claim 1, wherein the silicon buffer layer is comprised of monocrystal and the extrinsic base formation layer is comprised of polycrystal.

4. The bipolar transistor according to claim 1, wherein each of the extrinsic base formation layer and the silicon buffer layer has a thickness of not less than 60 nm and not more than 120 nm.

* * * * *